US011385543B2

(12) United States Patent
Toukhy et al.

(10) Patent No.: US 11,385,543 B2
(45) Date of Patent: Jul. 12, 2022

(54) ENVIROMENTALLY STABLE, THICK FILM, CHEMICALLY AMPLIFIED RESIST

(71) Applicant: RIDGEFIELD ACQUISITION, Luxembourg (LU)

(72) Inventors: Medhat A. Toukhy, Flemington, NJ (US); Weihong Liu, Branchburg, NJ (US); PingHung Lu, Bridgewater, NJ (US)

(73) Assignee: Merck Patent GmbH, Darmstadt (DE)

( * ) Notice: Subject to any disclaimer, the term of this patent is extended or adjusted under 35 U.S.C. 154(b) by 393 days.

(21) Appl. No.: 16/323,005

(22) PCT Filed: Aug. 7, 2017

(86) PCT No.: PCT/EP2017/069943
§ 371 (c)(1),
(2) Date: Feb. 4, 2019

(87) PCT Pub. No.: WO2018/029142
PCT Pub. Date: Feb. 5, 2018

(65) Prior Publication Data
US 2020/0183278 A1    Jun. 11, 2020

Related U.S. Application Data

(60) Provisional application No. 62/372,573, filed on Aug. 9, 2016.

(51) Int. Cl.
| | | |
|---|---|---|
| *G03F 7/039* | (2006.01) | |
| *G03F 7/004* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |

(52) U.S. Cl.
CPC .......... *G03F 7/0392* (2013.01); *G03F 7/0045* (2013.01); *G03F 7/162* (2013.01); *G03F 7/168* (2013.01); *G03F 7/2004* (2013.01); *G03F 7/322* (2013.01); *G03F 7/38* (2013.01)

(58) Field of Classification Search
CPC .... G03F 7/0392; G03F 7/0395; G03F 7/0045; G03F 7/0397
See application file for complete search history.

(56) References Cited

U.S. PATENT DOCUMENTS

| | | |
|---|---|---|
| 5,492,793 A | 2/1996 | Breyta et al. |
| 5,625,020 A | 4/1997 | Breyta et al. |
| 5,641,604 A | 6/1997 | Sinta et al. |
| 5,736,296 A | 4/1998 | Sato et al. |
| 5,948,589 A | 9/1999 | Sato et al. |
| 5,985,507 A | 11/1999 | Blakeney et al. |
| 6,004,724 A | 12/1999 | Yamato et al. |
| 6,027,804 A | 2/2000 | Chou et al. |
| 6,033,826 A | 3/2000 | Urano et al. |
| 6,072,006 A | 6/2000 | Bantu et al. |
| 6,114,462 A | 9/2000 | Watanabe et al. |
| 6,124,405 A | 9/2000 | Mertesdorf et al. |
| 6,133,412 A | 10/2000 | Malik et al. |
| 6,136,504 A | 10/2000 | Tan et al. |
| 6,159,653 A | 12/2000 | Malik et al. |
| 6,262,181 B1 | 7/2001 | Bantu et al. |
| 6,274,286 B1 | 8/2001 | Hatakeyama et al. |
| 6,284,427 B1 | 9/2001 | Okazaki et al. |
| 6,309,793 B1 | 10/2001 | Malik et al. |
| 6,365,321 B1 | 4/2002 | Chen et al. |
| 6,465,150 B1 | 10/2002 | Numata et al. |
| 6,506,537 B2 | 1/2003 | Kobayashi et al. |
| 6,593,056 B2 | 7/2003 | Takeda et al. |
| 6,630,282 B2 | 10/2003 | Oomori et al. |
| 6,673,512 B1 | 1/2004 | Uenishi et al. |
| 6,686,121 B2 | 2/2004 | Okazaki et al. |
| 6,743,562 B2 | 6/2004 | Momota et al. |
| 6,830,317 B2 | 12/2004 | Tsuchii et al. |
| 6,830,870 B2 | 12/2004 | Malik et al. |

(Continued)

FOREIGN PATENT DOCUMENTS

| | | |
|---|---|---|
| CN | 1239556 A | 12/1999 |
| CN | 104781731 A | 7/2015 |

(Continued)

OTHER PUBLICATIONS

Gary Solomon, "Process integration of electroplated solder bumps for WLP", Solid State Technology, http://electroiq.com/blog/2001/11/process-integration-of-electroplated-solder-bumps-for-wlp/, (Nov. 1, 2001). Downloaded Mar. 31, 2016.
Translation of Office Action and Search Report issued by the Taiwan Patent Office, dated Sep. 4, 2020.
JP2002-341538 A Machine Language English Abstract and Translation from JPO of JP2002-341538 A.
JP2002-278054 A Machine Language English Abstract and Translation from JPO of JP2002-278054 A.
JP2002-278053 A Machine Language English Abstract and Translation from JPO of JP2002-278053 A.
Translation of Office Action and Search Report issued by the Taiwan Patent Office, dated Sep. 4, 2020.
JP2002-341538 A Machine Language English Abstract and Translation from JPO of JP2002-341538 A.
JP2002-278054 A Machine Language English Abstract and Translation from JPO of JP2002-278054 A.

(Continued)

*Primary Examiner* — Daborah Chacko-Davis
(74) *Attorney, Agent, or Firm* — Francis M. Houlihan

(57) ABSTRACT

Environmentally stable, chemically amplified (CA) positive resist compositions are described. These resist compositions are based on a blend of at least two types of polymer platforms. The first platform is a low activation energy, acetal blocked polyhydroxystyrene (PHS) based resin; the second platform is an acrylate based resin containing a high activation energy acid labile group [such as tertiary-butyl acrylate(t-BA)]. The resist composition also contains a photo-acid generator (PAG), a base quencher, a surfactant dissolved in a suitable solvent. Also described, is the use of these resist composition in a method for forming a photoresist relief image on a substrate.

21 Claims, 10 Drawing Sheets

(56) References Cited

U.S. PATENT DOCUMENTS

Figure 1:
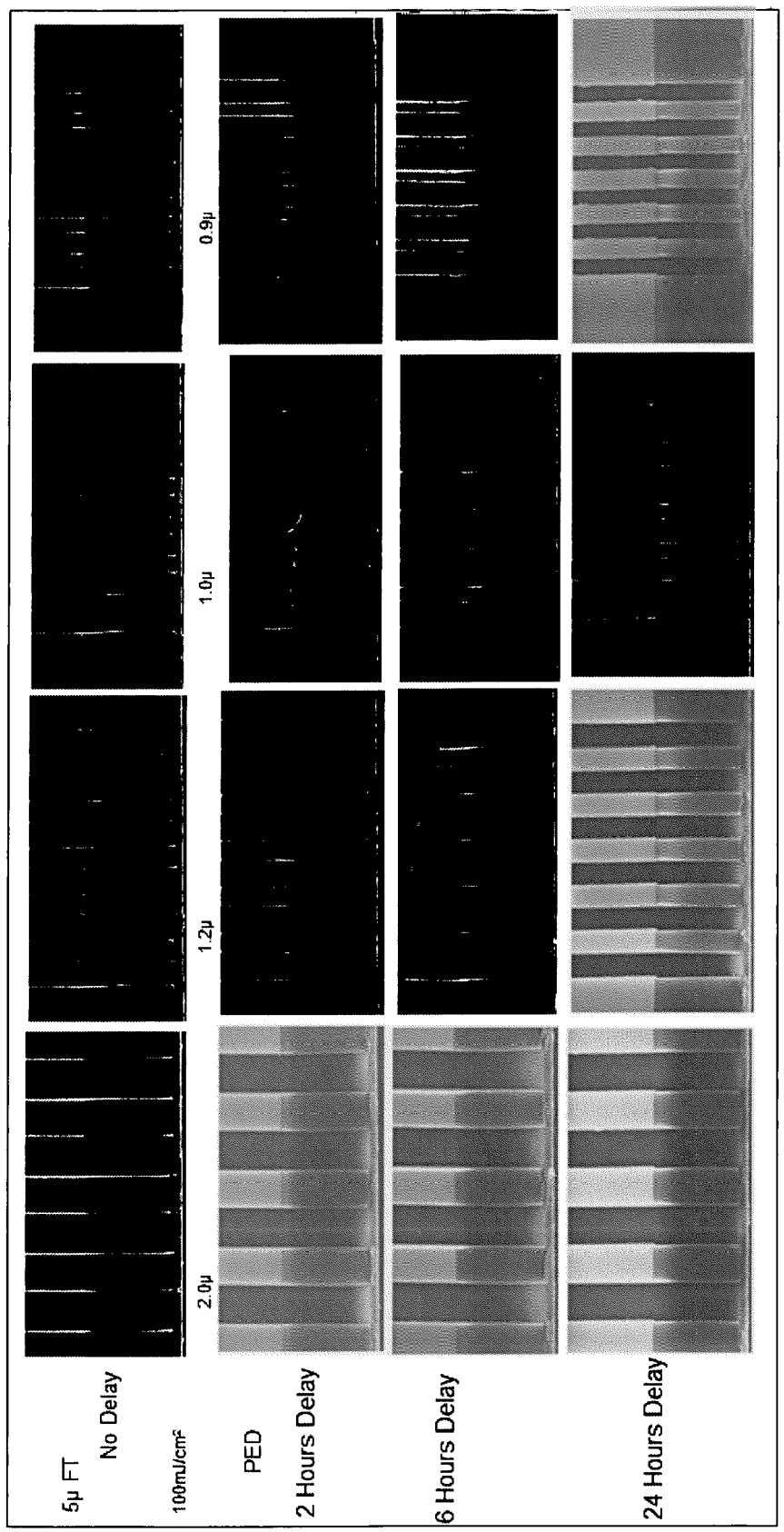

| | | | |
|---|---|---|---|
| 6,852,465 | B2 | 2/2005 | Dammel et al. |
| 6,852,467 | B2 | 2/2005 | Aoai et al. |
| 6,869,744 | B2 | 3/2005 | Hatakeyama |
| 6,991,888 | B2 | 1/2006 | Padmanaban et al. |
| 7,144,674 | B2 | 12/2006 | Namba et al. |
| 7,255,970 | B2 | 8/2007 | Toukhy et al. |
| 7,297,616 | B2 | 11/2007 | Cameron et al. |
| 7,358,028 | B2 | 4/2008 | Maruyama et al. |
| 7,358,408 | B2 | 4/2008 | Rahman et al. |
| 7,666,569 | B2 | 2/2010 | Sato et al. |
| 7,871,756 | B2 | 1/2011 | Takahashi et al. |
| 7,923,192 | B2 | 4/2011 | Hirayama et al. |
| 7,972,763 | B2 | 7/2011 | Suetsugu et al. |
| 8,715,918 | B2 | 5/2014 | Toukhy et al. |
| 8,795,945 | B2 | 8/2014 | Fujii et al. |
| 8,841,062 | B2 | 9/2014 | Liu et al. |
| 2002/0012869 | A1 | 1/2002 | Adams et al. |
| 2004/0265733 | A1 | 12/2004 | Houlihan et al. |
| 2005/0037291 | A1 | 2/2005 | Nitta et al. |
| 2005/0208733 | A1 | 9/2005 | Yin et al. |
| 2005/2791974 | | 12/2005 | Rahman et al. |
| 2008/0220597 | A1 | 9/2008 | Cameron et al. |
| 2014/0154624 | A1* | 6/2014 | Liu ..................... G03F 7/0397 430/270.1 |
| 2015/0086927 | A1 | 3/2015 | Sughara |
| 2016/0085148 | A1 | 3/2016 | Zhang |

FOREIGN PATENT DOCUMENTS

| | | |
|---|---|---|
| EP | 0609684 A1 | 10/1994 |
| EP | 0939339 A1 | 9/1999 |
| EP | 1126321 A1 | 8/2001 |
| EP | 1415968 A1 | 5/2004 |
| JP | 58-194834 | 11/1983 |
| JP | 3-185448 | 8/1991 |
| JP | 4-211258 | 8/1992 |
| JP | 6-43651 | 2/1994 |
| JP | 6-148889 | 5/1994 |
| JP | 6-289614 | 10/1994 |
| JP | 7-134412 | 5/1995 |
| JP | 9-68795 | 11/1997 |
| JP | 10-31309 A | 2/1998 |
| JP | 10-204125 | 4/1998 |
| JP | 10-207066 A | 8/1998 |
| JP | 10-268508 A | 10/1998 |
| JP | 2001-42531 A | 2/2001 |
| JP | 2002-62656 A | 2/2002 |
| JP | 2002-72479 A | 3/2002 |
| JP | 2002-99090 A | 4/2002 |
| JP | 2002-278053 A | 9/2002 |
| JP | 2002-278054 A | 9/2002 |
| JP | 2002-341538 A | 11/2002 |
| JP | 2003-50460 A | 2/2003 |
| JP | 2003-84437 A | 3/2003 |
| JP | 2004-317907 A | 11/2004 |
| TW | 200506516 A | 2/2005 |
| TW | 200523677 A | 7/2005 |
| TW | 200916957 A | 4/2009 |
| TW | 201133136 A | 10/2011 |
| TW | 201428426 A | 7/2014 |
| TW | 201522449 A | 6/2015 |
| WO | 2005-081062 | 9/2005 |

OTHER PUBLICATIONS

JP2002-278053 A Machine Language English Abstract and Translation from JPO of JP2002-278053 A.
JP2002-72479 A Machine Language English Abstract and Translation from JPO of JP2002-72479 A.
JP2001-42531 A Machine Language English Abstract and Translation from JPO of JP2001-42531 A.
Jeffrey M. Guevremont et al., "Multiple Anion Nonvolatile Acetal MANA) Resists", SPIE vol. 4343, pp. 255-pp. 267 (2001). Donghwal Lee et al., "Application of newly synthesized poly(hydroxystyrene-acrylate) copolymers to improve vacuum stability on E-beam resist for mask fabrication", SPIE vol. 5376, pp. 565-pp. 574 (2004).
Knop A. and Scheib, W.;"Chemistry and Application of Phenolic Resins", Springer Verlag, N.Y., 1979 in Chapter 4.
Tsuguo Yamaoka et al., "Reactions of vinyl ethers and application to photoreactive process", CAS vol. 17, pp. 46-pp. 70 (2004).
Tsuguo Yamaoka et al., "Reactions of Vinyl Ethers and Application to Photoreactive Process", J. Photopolym. Sci, Technol. vol. 17 No. 3, pp. 341-pp. 360 (2004).
Machine-assisted English translation of JP2003-84437 as provided by JPO (2003).
English Language Abstract of JP 10-31309 A.
Toukhy et al., "Chemically amplified, thick film, i-line positive resist for electroplating and redistribution applications", XP-002513378, SPIE vol. 6153 pp. 61534H-1-pp. 61534H-8 (2006).
English Language Abstract of JP3-158448 A.
English Language Abstract of JP4-211258 A.
English Language Abstract of JP58-194834 A.
Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/002593 (PCT Publication WO2009-040661).
International Search Report, PCT/EP2017/069943, dated Oct. 23, 2017, relates to U.S. Appl. No. 16/323,005, filed Feb. 4, 2019.
Machine translation of CN1239556A.
Machine English Translation of Abstract for JP6-289614.
Machine English Translation of Abstract for JP7-134412.
Machine English Translation of Abstract for JP9-068795.
Machine English Translation of Abstract for JP10-204125.
Machine English Translation of Abstract for JP10-207066.
Machine English Translation of Abstract for JP10-268508.
Machine English Translation of Abstract for JP2002-62656.
Machine English Translation of Abstract for JP2002-99090A.
Machine English Translation of Abstract for JP2003-50460.
Machine English Translation of Abstract for JP2004-317907A.
Machine English Translation of Abstract for JP 1994021158.
Machine English Translation of Abstract for JP 1994043651.
Machine English Translation for JP6-148889.
Office Action dated Jan. 29, 2022 in CN Application No. 201780048100.3 and received on Feb. 14, 2022.

* cited by examiner ue # ENVIROMENTALLY STABLE, THICK FILM, CHEMICALLY AMPLIFIED RESIST This application is a United States National Stage Patent Application under 35 U.S.C. § 371 of International Patent Application No. PCT/EP2017/069943, filed Aug. 7, 2017, which claims priority to U.S. Provisional Patent Application No. 62/372,573, filed Aug. 9, 2016, the contents of each of which are being hereby incorporated herein by reference.

Environmentally stable, chemically amplified (CA) positive resist compositions are described. These resist compositions are based on a blend of at least two types of polymer platforms. The first platform is a low activation energy, acetal blocked polyhydroxystyrene (PHS) based resin; the second platform is an acrylate based resin containing a high activation energy acid labile group [such as tertiary-butyl acrylate (t-BA)]. The resist composition also contains a photo-acid generator (PAG), a base quencher, a surfactant dissolved in a suitable solvent. Also described, is the use of these resist composition in a method for forming a photoresist relief image on a substrate.

BACKGROUND OF THE INVENTION

Photoresist compositions are used in microlithography processes for making miniaturized electronic components such as in the fabrication of integrated circuit devices. Generally, in these processes, a coated film of a photoresist composition is applied to a substrate such as silicon wafers used for making integrated circuits, circuit boards and flat panel display substrates. The coated substrate is then baked to evaporate any solvent in the photoresist composition and to fix the coating onto the substrate. The baked coated surface of the substrate is next subjected to an image-wise exposure to actinic radiation.

This actinic radiation exposure causes a chemical transformation in the exposed areas of the coated surface. Visible light, ultraviolet (UV) light, extreme ultraviolet (EUV), electron beam and X-ray radiant energy are radiation types commonly used today in microlithographic processes. After this image-wise exposure, the coated substrate is treated with a developer solution to dissolve and remove either the radiation-exposed areas (for positive-type photoresists) or the unexposed areas (for negative-type photoresists) of the coated surface of the substrate.

After this development operation, the now partially unprotected substrate may be treated with a substrate-etchant solution, plasma gases or reactive ions, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

In the manufacture of patterned structures, such as wafer level packaging, displays, light emitting diode applications or microelectromechanical systems, electrochemical deposition of electrical interconnects has been used as the interconnect density increases. For example, see Gary Solomon, "Process integration of electroplated solder bumps for WLP", Solid State Technology, http://electroiq.com/blog/2001/11/process-integration-of-electroplated-solder-bumps-for-wlp/, Nov. 1, 2001. Gold bumps, copper or other metal posts and copper traces for redistribution in wafer level packaging require a photoresist mold that can later be electroplated to form the final metal structures in advanced interconnect technologies. The photoresist layers are very thick compared to the photoresists used in the IC manufacturing of critical layers. Both feature size and photoresist thickness are typically in the range of 2 µm to 100 µm, (micrometers) so that high aspect ratios (photoresist thickness to line size) have to be patterned in the photoresist.

Positive-acting photoresists comprising Novolak polymers and quinone-diazide compounds as photoactive compounds dissolved in conventional spin casting solvent such as PGMEA or PGME are well known in the art. Novolak polymers may also be reacted with quinone diazides and combined with a polymer. It has been found that photoresists based on only Novolak/diazide do not have the photosensitivity or the steepness of sidewalls necessary for certain type of processes, especially for very thick films. Moreover a high dark-film loss in the developer is often observed and such coating may have poor coating uniformity.

Known chemically amplified photoresists, such as those based on blocked poly-4-hydroxystyrene (PHOST), blocked copolymers comprising hydroxystyrene and a blocked (meth)acrylic acid repeat unit such as tert-butyl (meth) acrylate, or (meth)acrylic materials comprising alicyclic groups, acid labile groups, and dissolution modifying groups such as anhydrides or lactones dissolved in conventional spin casting solvent such PGMEA or PGME as may exhibit the required photosensitivity and thickness requirement, but may also exhibit adhesion failure, during subsequent unit operations such as plating or etching. Moreover, these materials may also exhibit poor coating uniformity and also have poor process latitude against pattern collapse during post-exposure processing such as development and/or rinsing. Such failures may lead to feature sidewalls that are rough, undercut or have protrusions somewhere in the metal feature and produce features with high defect counts because of the lack of process latitude against pattern collapse and poor coating uniformity. Moreover, these photoresists may be prohibitively expensive.

Chemically amplified resist comprising mixtures of Novolak polymers with polymers based on blocked poly-4-hydroxystyrene (PHOST), blocked copolymers comprising hydroxystyrene and a blocked (meth)acrylic acid repeat unit such as tert-butyl (meth)acrylate, or (meth)acrylic materials comprising alicyclic groups, acid labile groups, and dissolution modifying groups such as anhydrides or lactones dissolved in conventional spin casting solvent such PGMEA (1-methoxy 3-propylacetate) or PGME (1-methoxy-propanol) may exhibit the required photosensitivity and thickness requirement, but may also exhibit adhesion failure, during subsequent unit operations such as plating or etching. Moreover, these materials may also exhibit poor coating uniformity and also have poor process latitude against pattern collapse during unit operations. Such failures may lead to feature sidewalls that are rough, undercut or have protrusions somewhere in the metal feature and produce features with high defect counts because of the lack of process latitude against pattern collapse and poor coating uniformity.

Photoresist compositions are used in microlithography processes for making miniaturized electronic components such as in the fabrication of computer chips and integrated circuits. Generally, in these processes, a coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble in such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution, plasma gases, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

In the manufacture of patterned structures, such as wafer level packaging, electrochemical deposition of electrical interconnects has been used as the density of the interconnects increases. For example, see Gary Solomon, "Process integration of electroplated solder bumps for WLP", Solid State Technology, http://electroiq.com/blog/2001/11/process-integration-of-electroplated-solder-bumps-for-wlp/, Nov. 1, 2001.

Gold bumps, copper posts and copper wires for redistribution in wafer level packaging require a resist mold that is later electroplated to form the final metal structures in advanced interconnect technologies. The resist layers are very thick compared to the photoresists used in the IC manufacturing of critical layers. Both feature size and resist thickness are typically in the range of 2 μm to 100 μm, so that high aspect ratios (resist thickness to line size) have to be patterned in the photoresist.

Devices manufactured for use as microelectromechanical machines also use very thick photoresist films to define the components of the machine.

SUMMARY OF THE INVENTION

One aspect of the invention is a novel photoresist composition comprising of Component (1), which comprises a reaction product formed in the absence of an acid catalyst between reactants (i) to (iii) where (i) is a Novolak polymer, (ii) is a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) is a compound selected from the group consisting of a vinyl ether and an unsubstituted unsaturated heteroalicyclic and a substituted unsaturated heteroalicyclic.

Component (2), which comprises a compound with at least one heterocyclic thiol compound comprising a ring structure chosen from the general formulas:

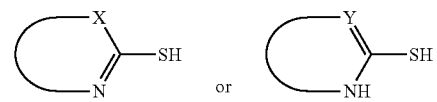

or tautomer's thereof, wherein the ring structure is a single ring structure having 4-8 atoms, or a multi ring structure having 5-20 atoms, and wherein the single ring structure or the multi ring structure comprises an aromatic, non-aromatic, or heteroaromatic ring, and wherein X is coupled into the ring by a single bond and is selected from the group consisting of $CR_aR_b$, O, S, Se, Te, and $NR_c$, or X is coupled into the ring by a double bond and is selected from the group consisting of $CR_a$, and N, and Y is selected from the group consisting of $CR_a$ and N, and wherein $R_a$, $R_b$, and $R_c$ are independently selected from the group consisting of H, a substituted alkyl group having 1-8 carbon atoms, an unsubstituted alkyl group having 1-8 carbon atoms, a substituted alkenyl group having 1-8 carbon atoms, an unsubstituted alkenyl group having 1-8 carbon atoms, a substituted alkynyl group having 1-8 carbon atoms, an unsubstituted alkynyl group having 1-8 carbon atoms, a substituted aromatic group having 1-20 carbon atoms, a substituted heteroaromatic group having 1-20 carbon atoms, an unsubstituted aromatic group having 1-20 carbon atoms and an unsubstituted hetero-aromatic group having 1-20 carbon atoms; Component (3), comprising at least one polymer comprised of formula:

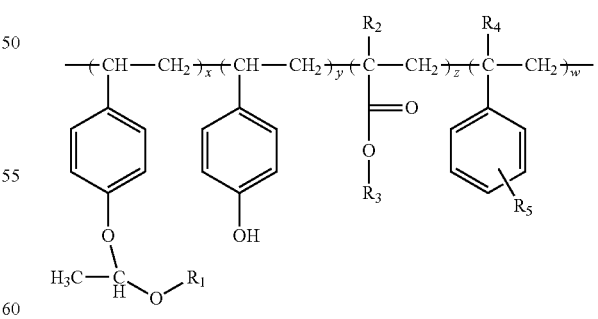

wherein $R_1$ is a unsubstituted or substituted alkyl or unsubstituted or substituted cycloalkyl, $R_2$, is hydrogen or a $C_1$ to $C_4$ alkyl, $R_3$ is a $C_1$ to $C_4$ alkyl or a $C_2$ to $C_4$ alkylenehydroxy moiety, $R_4$ is hydrogen or a $C_1$ to $C_4$ alkyl, $R_5$ is hydrogen or $C_1$ to $C_4$ alkyl, and x, y, z, and w are the mole % of each type of repeat unit where x is equal to about 30 to about 40 mole %, y is equal to about 60 to about 70 mole %, z is equal to about 0 to about 10 mole %, where the sum of x, y, z, and w is equal to 100 mole % and the sum of z' and w does not exceed about 10 mole %.

Component (4), comprises at least one photo acid generator additive which, upon under irradiation with radiation having a wavelength between about 365.4 nm and about 578.2 nm, releases a strong acid having a pKa equal to or smaller than −1;

Component (5), comprising at least one base additive.

Component (6), comprising an optional adhesion promoter selected from a Novolak polymer, or a polyvinyl alkyl ether polymer.

And finally, Component (7), comprising a solvent.

Another aspect of this invention is a method for forming a photoresist relief image on a substrate comprising: (a) applying on a substrate a layer of the photoresist composition formed from the above novel photoresist composition, and (b) exposing the photoresist layer to activating radiation and developing the exposed photoresist layer.

DETAILED DESCRIPTION OF DRAWINGS

FIG. 1: SEM study showing that Formulation (1) provided PED stability up to 24 hours.

Figure 1A:
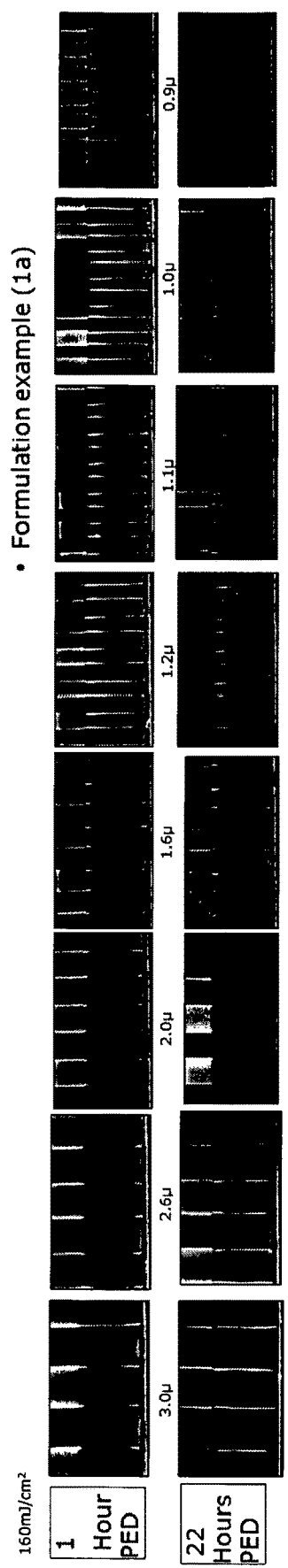

FIG. 1a: SEM study showing that Formulation (1a) provided PED stability up to 22 hours.

Figure 2:
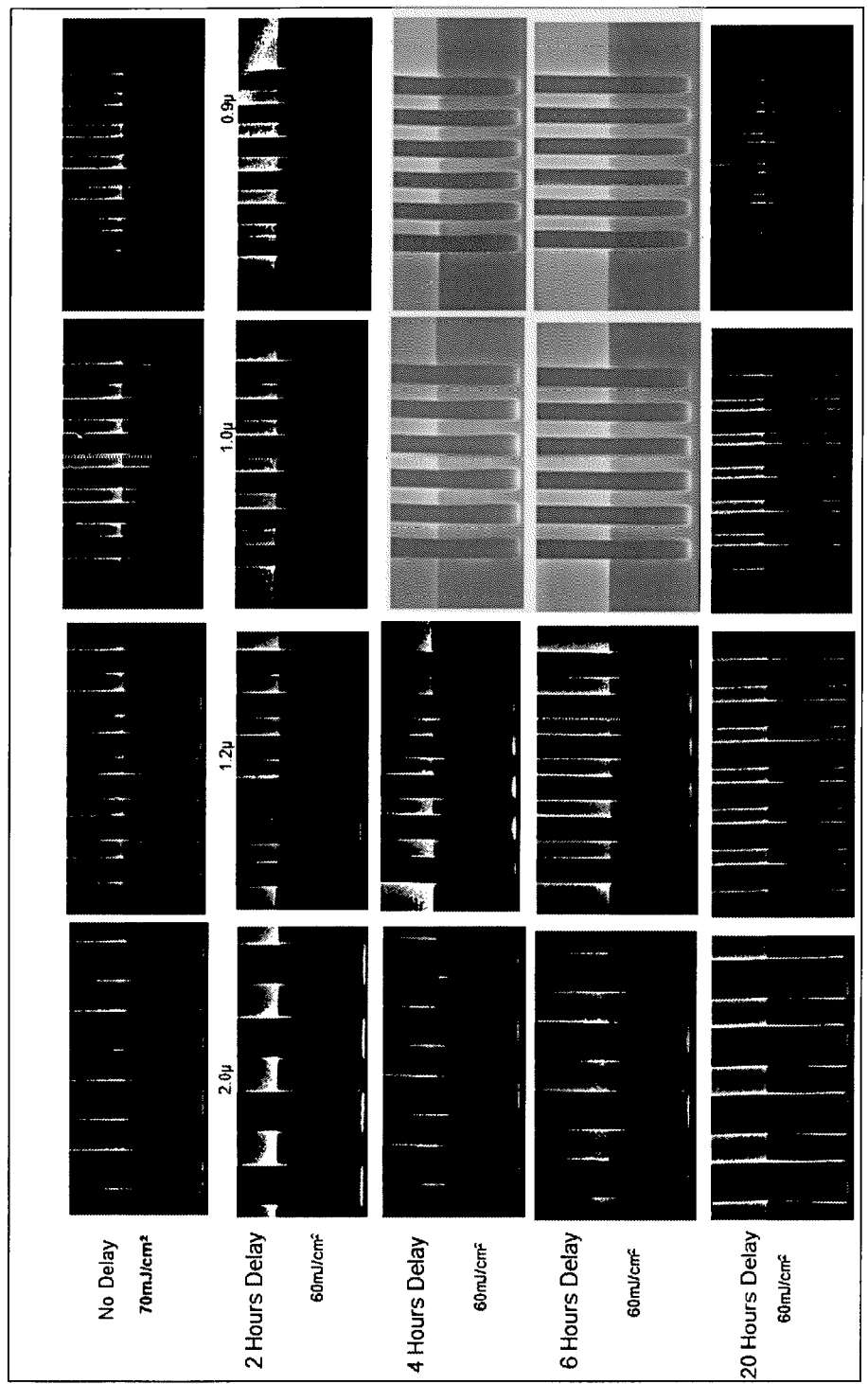

FIG. 2: SEM study showing that Formulation (2) provided PED stability up to 20 hours.

Figure 3:
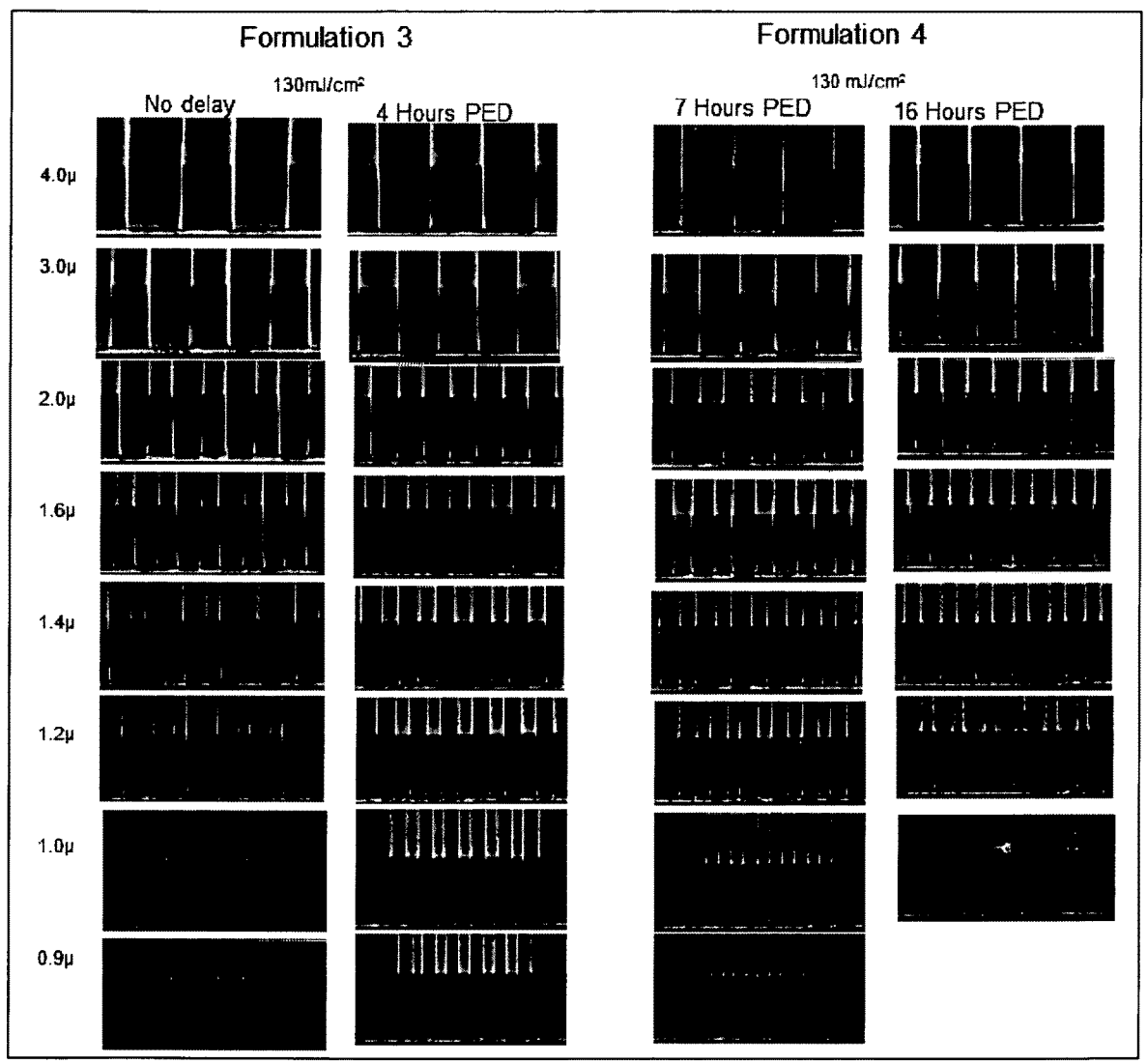
Figure 4:
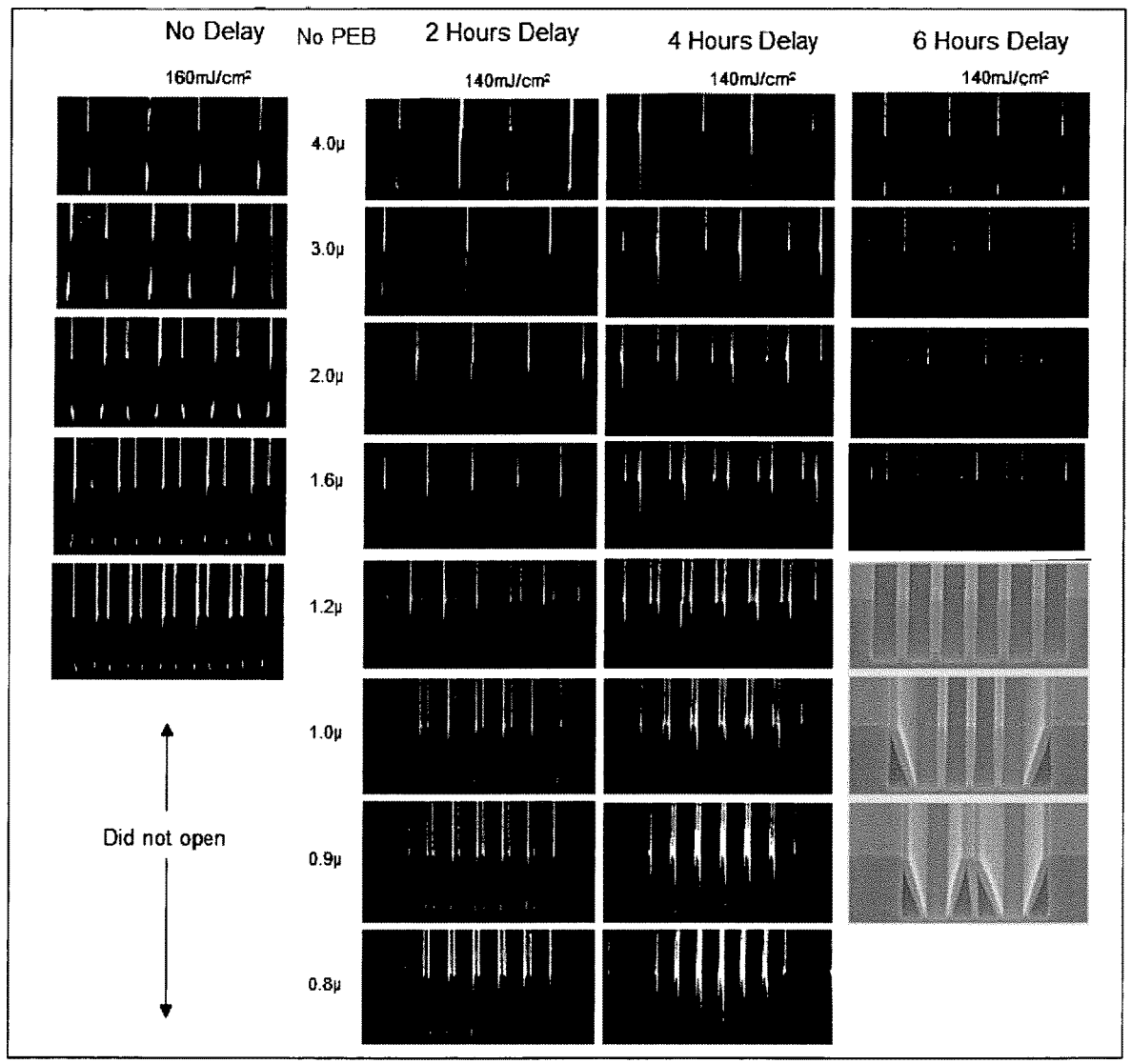
Figure 5:
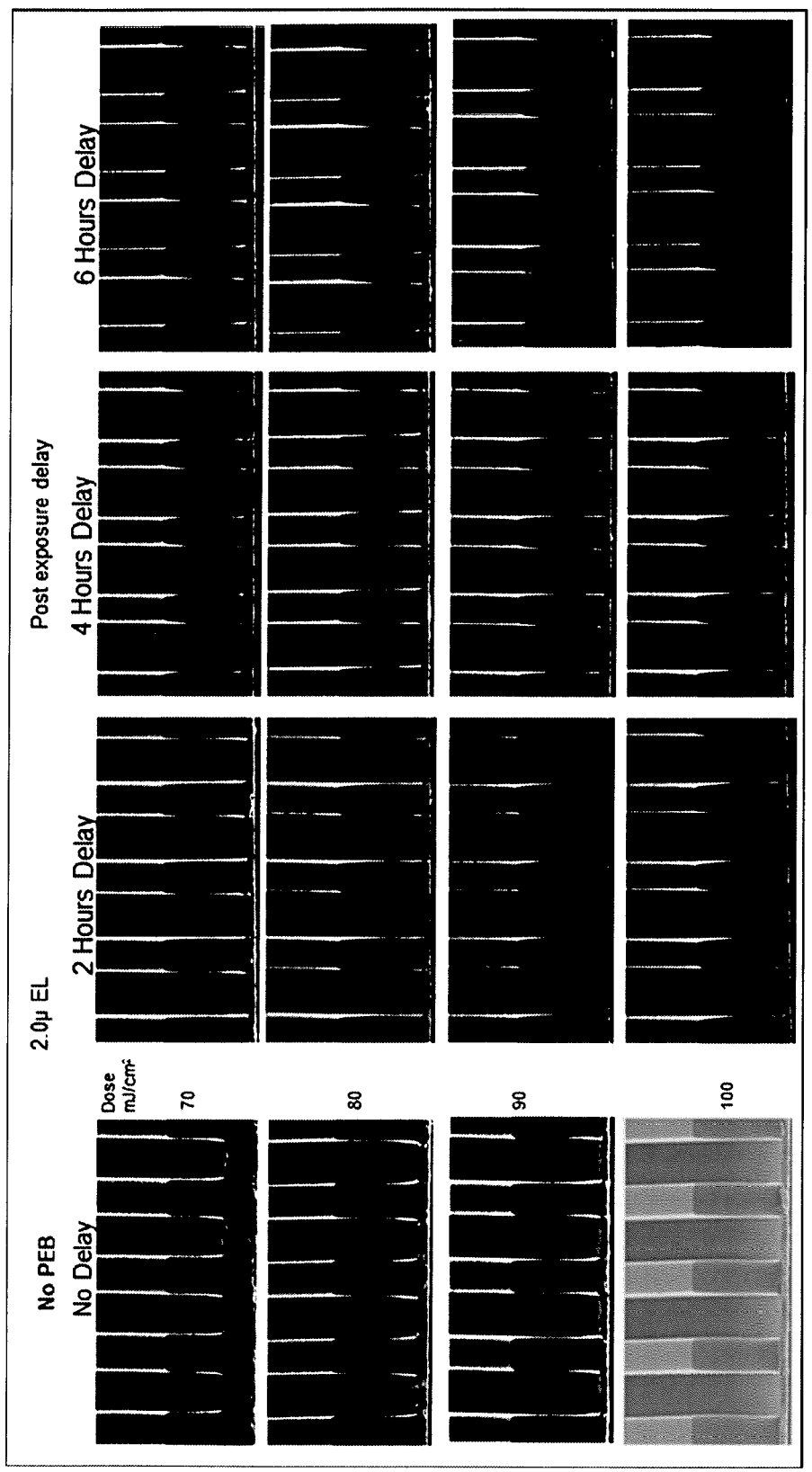

FIG. 3: SEM study showing that Formulations (3) and (4) gives poor PED stability FIG. 4: SEM study showing that Formulation (6) gives poor PED stability FIG. 5: SEM study showing that Formulation (6) gives poor PED stability FIG. 6: SEM Comparison between Formulation (1) and AZ® MiR-900 and AZ® 10XT showing that AZ® MiR-900 and AZ® 10XT give poorer pattern profiles with tapered sidewalls and footing compared to Formulation (1).

Figure 7:
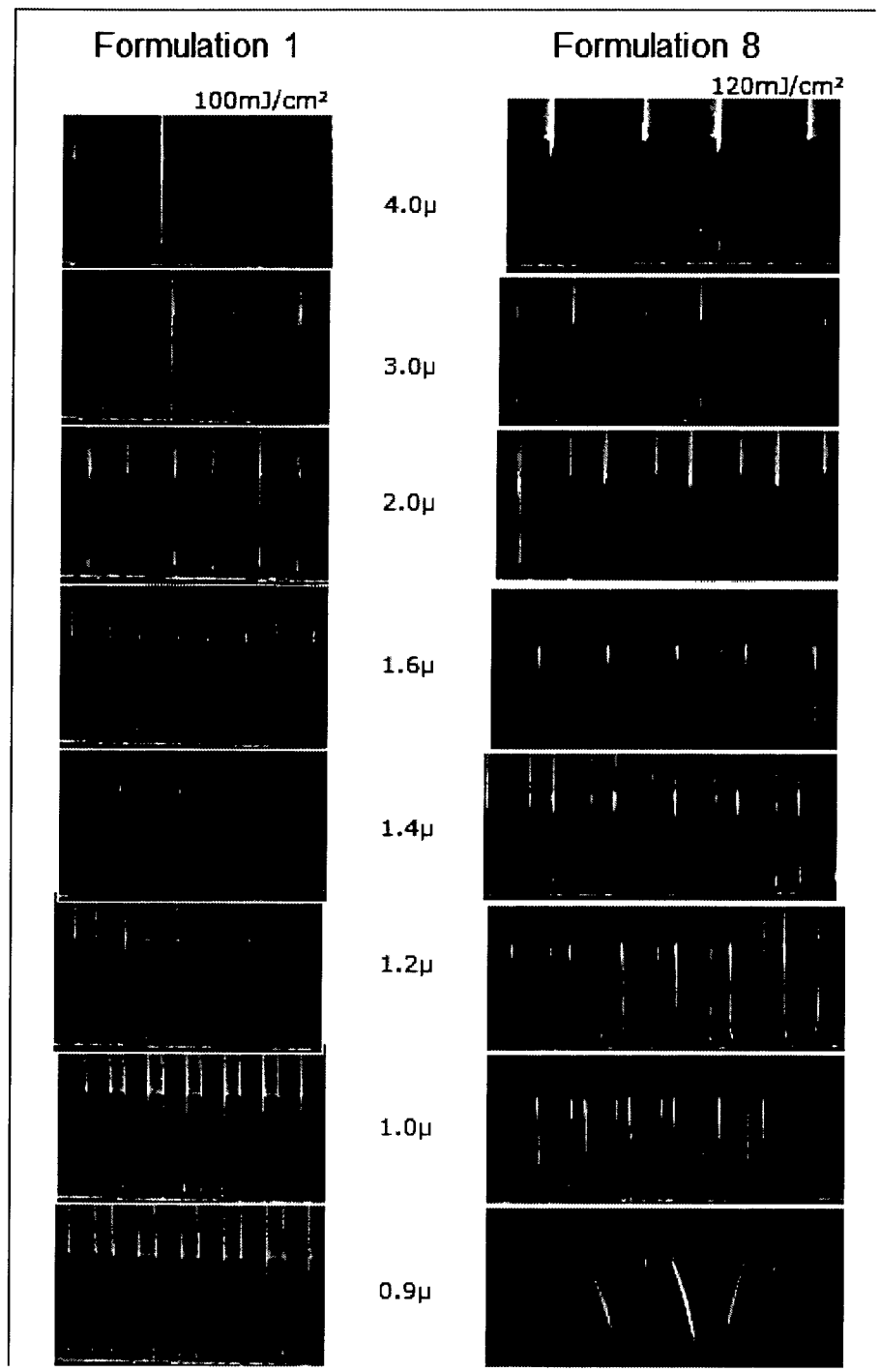

FIG. 7: Formulation (1) compared to Formulation (8), showing the influence of the differences in their acetal blocked PHS polymer.

Figure 8:
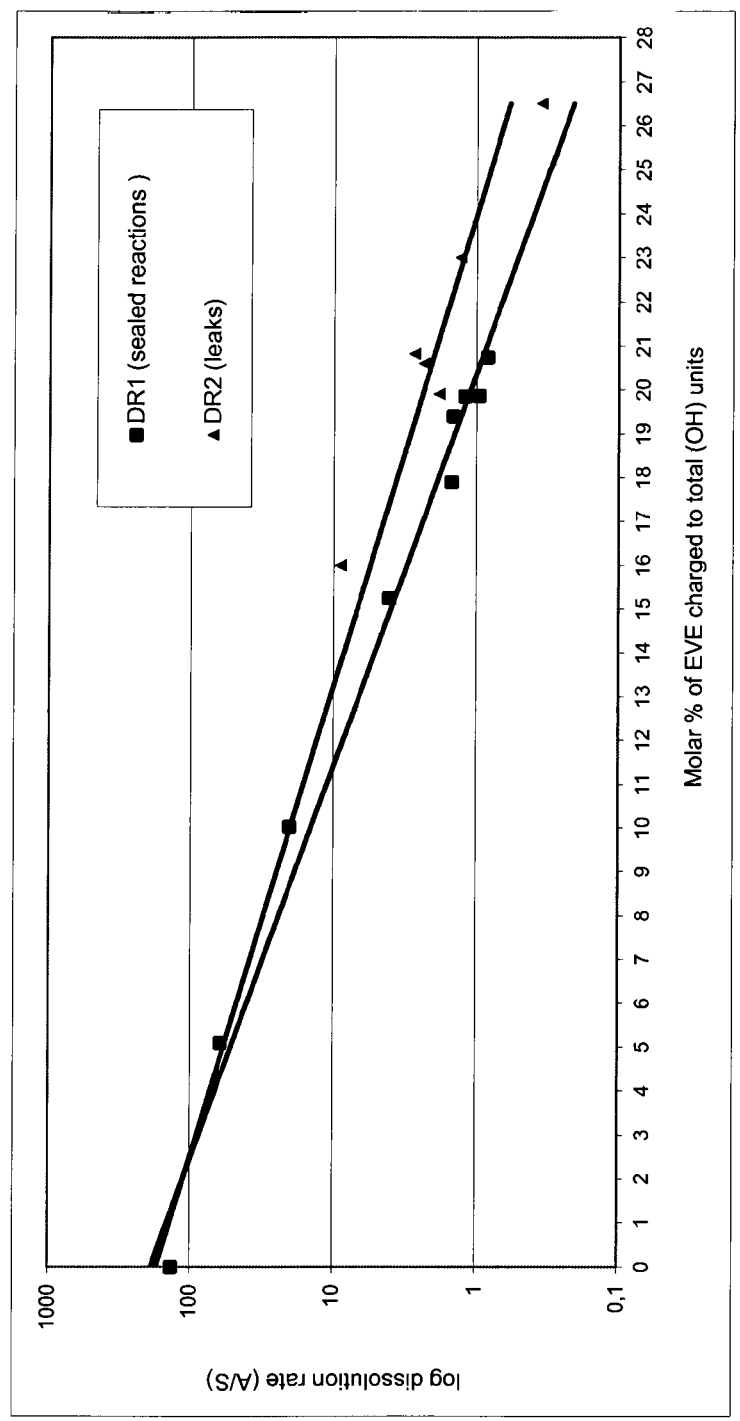

FIG. 8: The dissolution rate (DR) of CN6 polymer as a function of reacted EVE

Figure 9:
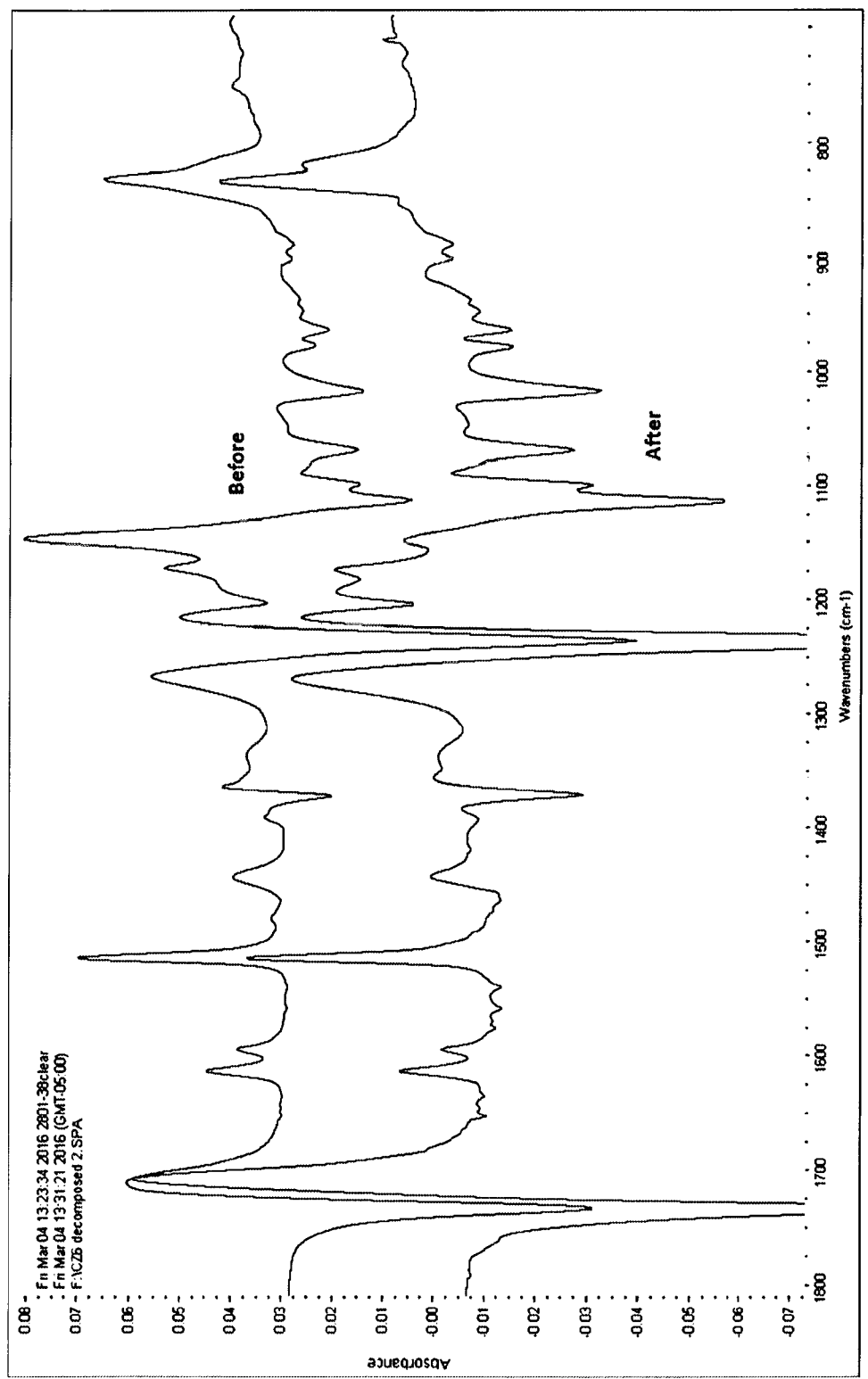

FIG. 9: FT-IR spectra study of CZ6 polymer before (top) and after heating in presence of para-toluenesulfonic acid (bottom)

DETAILED DESCRIPTION OF THE INVENTION

As used herein, the conjunction "or" is not intended to be exclusive unless otherwise indicated or required by the context. For example, the phrase "or, alternatively" is intended to be exclusive. As a further example, "or" may be exclusive when describing chemical substitution at a specific site.

As used herein, the term "repeat unit" refers to a polymer repeat unit derived from a monomer.

As used herein, it is understood that a repeat unit within a polymer may be referred to by its corresponding monomer. For example, acrylate monomer (I) corresponds to its polymer repeat unit (II).

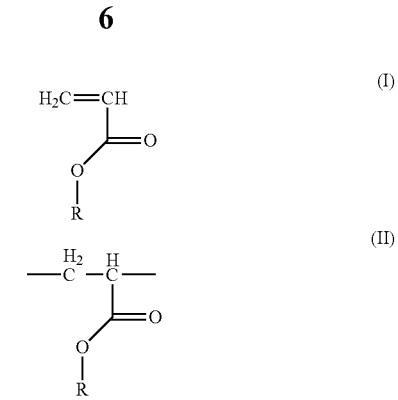

As used herein, the designation "(meth)acrylate repeat unit" may refer to an acrylate repeat unit or, alternatively, a methacrylate repeat unit. Accordingly, "acrylic acid" and "methacrylic acid" are collectively referred to as "(meth)acrylic acid", an "acrylic acid derivative" and a "methacrylic acid derivative" are collectively referred to as a "(meth) acrylic acid derivative", and "acrylate" and "methacrylate" are collectively referred to as "(meth)acrylate".

As used herein the term "acid labile group" (a.k.a acid cleavable group) embodies protecting group cleavable (a.k.a. labile) by a catalytic amount of acid a process of acidolysis or through the hydrolysis of a ketal or acetal protective moiety table carbocation or by the hydrolysis of a ketal, acetal or silyl moieties. The acidolysis process proceeds upon the catalytic action of a proton on a suitable protecting group cleavable by acidolysis and involves the intermediacy of a tertiary carbocation, or a stabilized secondary carbocation (e.g. secondary benzylic, allylic and the like). Further, this intermediate carbocation formed by the acid labile group must have available at least one hydrogen attached to a carbon directly attached to the carbocation carbon. This allows the carbocation to participate in an elimination reaction to form an olefin and regenerate the acid moiety which initially formed the carbocation which may the proceed to cleave another group and so on.

Protective groups cleaving through a hydrolysis process may also be employed but only if these cleave through the intermediacy of a stable cation which can react with advantageous water to regenerate effectively the acid catalyst. Such protecting groups are ketals, acetals and silyl protecting groups.

Moieties which release primary, non-activated secondary carbocation or a tertiary carbocation which does not have an available beta-hydrogen are not effective acid cleavable protecting groups for these inventive positive working photosensitive composition because they have poor capability to regenerate the acid catalyst and consequently have poor acid cleaving efficiency and will not effectively result in chemical amplification, resulting in resist composition with poor or no lithographic sensitivity.

The term aryl refers to an aromatic moiety with one attachment point (e.g. phenyl, anthracyl, naphthyl, and the like). Apart from the attachment point, aryl group may be substituted with alkyl groups, alkyloxy, trialkylsilyl, trialkylsilyloxy, aryl, aryloxy groups or halides (e.g. F, Cl, I, Br).

The term alkyl refers to a linear, branched or cyclic alkane moiety with one attachment point (e.g. methyl, ethyl, propyl, n-butyl, tert-butyl, cyclohexyl and the like). Apart from the attachment point, alkyl groups may be substituted with alkyl groups, aryl groups or halides (e.g. F, Cl, I, Br). The number of carbons for specific alkyl moieties are as follows: $C_1$ to $C_{10}$ linear alkyl, a $C_3$ to $C_{10}$ branched alkyl, a $C_3$ to $C_{10}$ cyclic alkyl, a $C_4$ to $C_{10}$ alicyclic alkyl.

The term alkylene refers to a linear, branched or cyclic alkane moiety with two attachment point (e.g. methylene, ethylene, propylene and the like). Apart from the attachment points, alkylene groups may be substituted with alkyl groups, aryl groups, or halides (e.g. F, Cl, I, Br). The number of carbons for specific alkyl moieties is as follows: $C_1$ to $C_{10}$ linear alkylene, a $C_3$ to $C_{10}$ branched alkylene, a $C_3$ to $C_{10}$ cyclic alkylene, a $C_4$ to $C_{10}$ alicyclic alkylene.

The term alkyloxy refers to a linear, branched or cyclic alkane moiety with one attachment through oxygen (e.g. methoxy, ethoxy, propoxy, n-butoxy, tert-butoxy, cyclohexyloxy and the like). Apart from the attachment point, alkyl groups may be substituted with alkyl groups, aryl groups or halides (e.g. F, Cl, I, Br). The number of carbons for specific alkyl moieties are as follows: $C_1$ to $C_{10}$ linear alkyloxy, a $C_3$ to $C_{10}$ branched alkyloxy, a $C_3$ to $C_{10}$ cyclic alkyloxy, a $C_4$ to $C_{10}$ alicyclic alkyloxy.

The term alkylcarbonyloxy refers to a linear, branched or cyclic alkane moiety with one attachment through a carbonyloxy moiety (—C═O—O) (e.g. tert-butyloxycarbonyl, ethyloxycarbonyl, propyloxycarbonyl and the like).

The term aryloxy refers to an aryl moiety as defined as above with on attachment point through an oxygen (e.g. phenyloxy, anthracyloxy and the like)

The term alkylenearyl refers to an alkylene moiety which has one attachment point and an aryl substitutents (e.g. —$CH_2$-Aryl, —$CH_2$—$CH_2$-Aryl, and the like) where the aryl and alkylene moieties are otherwise defined as above.

The term "substituted" refers to monovalent substituents such as alkyl, akyloxy, halide (e.g. F, Cl, and Br), aryl, aryloxy, and combination thereof unless otherwise indicated.

One aspect of this invention is a photoresist composition comprising of the following components (1) to (7):

Component (1) which comprises a reaction product formed in the absence of an acid catalyst between reactants (i) to (iii), where (i) is a Novolak polymer, (ii) is a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) is a compound selected from a vinyl ether and an unsaturated unsubstituted or unsaturated substituted heteroalicyclic. In one aspect of this invention this reaction product has a dissolution rate less than 30 Å/second and preferably less than 5 Å/second in 0.26 N tetramethylammonium hydroxide (TMAH).

Component (2), comprises a compound containing at least one heterocyclic thiol compound comprising a ring structure chosen from the general formulas (III) or (IV) or tautomer's thereof, wherein the ring structure is a single ring structure having 4-8 atoms, or a multi ring structure having 5-20 atoms, and wherein the single ring structure or the multi ring structure comprises an aromatic, non-aromatic, or heteroaromatic ring, and wherein X is coupled into the ring by a single bond and is selected from the group consisting of $CR_aR_b$, O, S, Se, Te, and $NR_C$, or X is coupled into the ring by a double bond and is selected from the group consisting of $CR_a$, and N, and Y is selected from the group consisting of $CR_a$ and N, and wherein $R_a$, $R_b$, and $R_c$ are independently selected from the group consisting of H, a substituted alkyl group having 1-8 carbon atoms, an unsubstituted alkyl group having 1-8 carbon atoms, a substituted alkenyl group having 1-8 carbon atoms, an unsubstituted alkenyl group having 1-8 carbon atoms, a substituted alkynyl group having 1-8 carbon atoms, an unsubstituted alkynyl group having 1-8 carbon atoms, a substituted aromatic group having 1-20 carbon atoms, a substituted heteroaromatic group having 1-20 carbon atoms, an unsubstituted aromatic group having 1-20 carbon atoms and an unsubstituted hetero-aromatic group having 1-20 carbon atoms:

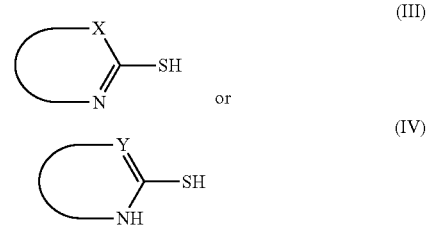

Component (3), comprising at least one polymer comprised of formula (V), in which $R_1$ is an unsubstituted or substituted alkyl or unsubstituted or substituted cycloalkyl. $R_2$, is hydrogen or a $C_1$ to $C_4$ alkyl, $R_3$ is a $C_1$ to $C_4$ alkyl or a $C_2$ to $C_4$ alkylenehydroxy moiety, $R_4$ is hydrogen or a $C_1$ to $C_4$ alkyl, $R_5$ is hydrogen or $C_1$ to $C_4$ alkyl, and x, y, z, and w are the mole % of each type of repeat unit where x is equal to about 30 to about 40 mole %, y is equal to about 60 to about 70 mole %, z is equal to about 0 to about 10 mole %, where the sum of x, y, z, and w is equal to 100 mole % and the sum of z and w does not exceed about 10 mole %: In another embodiment of this aspect of the invention R1 is a $C_1$ to $C_8$ alkyl.

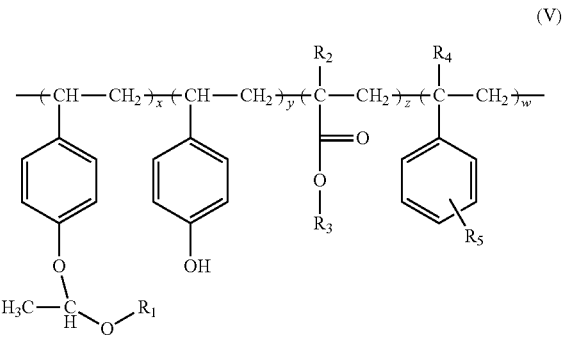

Component (4), comprises at least one photoacid generator additive which releases a strong acid having a pKa equal to or smaller than −1 which upon irradiation with radiation having a wavelength between about 365.4 nm and about 578.2 nm; Component (5), is at least one base additive; Component (6), comprises an optional adhesion promoter selected from a Novolak polymer, or a polyvinyl alkyl ether polymer, and finally Component (7), comprises a solvent.

For Component (1), the reactant (i), the Novolak, may be any resin made subjecting a phenol or a substituted phenol to an addition-condensation reaction of a phenol or substituted phenol (or a combination thereof) and an aldehyde or ketone (or a combination thereof), in the presence of an acid or a divalent metal salt catalyst, in a suitable reaction solvent, as are well known to one skilled in the art of photoresists. Suitable phenols include, but are not limited to, phenol, chlorophenols, fluorophenols, m-cresol, o-cresol, p-cresol, m-ethyl phenol, o-ethyl phenol, p-ethyl phenol, m-butyl phenol, o-butyl phenol, p-butyl phenol, trimethylsilylphenol, chloromethylphenol 2,3-xylenol, 2,4-xylenol, 2,5-xylenol, 2,6-xylenol, 3,4-xylenol, 3,5-xylenol, 3,6-xylenol, o-phenyl phenol, m-phenyl phenol, p-phenyl phenol, 2,3,5-trimethylphenol, 2,3,5-triethylphenol, 3,4,5-trimethylphenol, 4-tert-1-butylphenol, 3-tert-butylphenol, 2-tert-butylphenol, 2-tert-butyl-4-methylphenol, 2-tert-butyl-5-methylphenol and other alkyl-substituted phenols; p-methoxyphenol, m-methoxyphenol, o-methoxyphenol, p-ethoxyphenol, m-ethoxyphenol, o-ethoxyphenol, o-propoxyphenol, p-propoxyphenol, propoxyphenol and other alkoxy-substituted phenols; o-isopropenylphenol, p-isopropenylphenol, 2-methyl-4-isopropenylphenol, 2-ethyl-4-isopropenylphenol and other isopropenyl-substituted phenols: phenylphenol and other aryl-substituted phenols; 4,4'-dihydroxybiphenyl, bisphenol A, hydroquinone, resorcinol, 2-methyl resorcinol, 5-methyl resorcinol, pyrogallol, catechol, and other polyhydroxyphenols, as are well known to those skilled in the photoresist art. In one embodiment of this aspect of this composition these phenols may be used either alone or in an admixture of two or more, depending upon the dissolution rate desired. In a further embodiment of this aspect of the invention the reaction product, Component (1), has a dissolution rate between less than about 30 Å/second in 0.26 N tetramethylammonium hydroxide (TMAH), preferably less than about 5 Å/second.

In one embodiment of Component (1), the reactant (i), the Novolak, is one made by an addition-condensation reaction where an aldehyde is employed. In this embodiment an aldehyde may be employed alone or in combination of two or more aldehydes. Non limiting Examples of suitable aldehydes are formaldehyde, paraformaldehyde, acetaldehyde, benzaldehyde, furfural, trioxane, propionaldehyde, butylaldehyde, trimethylacetaldehyde, acrolein (acrylaldehyde), crotonaldehyde, cyclohexanaldehyde, furylacrolein, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde, and the like.

In another embodiment of component (1), the reactant (i), the Novolak, is one made by an addition-condensation reaction where a ketone is employed. In this embodiment a ketone may be employed alone or in combination of two or more ketone. Non limiting examples of suitable include acetone, methyl ethyl ketone, diethyl ketone and diphenyl ketone. Each of these ketones may be used singly or in combination. Further, an optional combination of any of aldehydes and any of ketones can be employed.

As an acid or a divalent metal salt catalyst, to make reactant (i) in Component (1) non-limiting examples of suitable materials are inorganic acids such as hydrochloric acid, nitric acid, sulfuric acid and the like, organic acids such as formic acid, oxalic acid, maleic acid and the like, and divalent inorganic metal salts of copper, cobalt, magnesium, manganese, nickel, zinc and the like. The reaction solvent is normally a hydrophilic solvent, such as methanol or dioxane.

In a further embodiment, Component (1), the reactant (i), is an alkali-soluble, film forming Novolak resins include phenol-formaldehyde Novolaks, cresol-formaldehyde Novolaks, and phenol-modified xylenol-formaldehyde Novolaks. Novolak resins have been commonly used in the art of photoresist manufacture as exemplified by "Chemistry and Application of Phenolic Resins", Knop A. and Scheib, W.; Springer Verlag, N.Y., 1979 in Chapter 4. In a more specific embodiment of this aspect of the invention the Novolak is selected from a cresol-formaldehyde Novolak.

Another more specific non-limiting example Component (1), the reactant (i), may be selected from an alkali-soluble, film forming Novolak resins cresol formaldehyde Novolak.

Another more specific non-limiting example of Component (1), the reactant (i), may be may be selected from a cresol formaldehyde Novolak such as the m-cresol/formaldehyde Novolaks, SPN-560 F, or SPN-560-S, produced by Allnex, Brussels, Belgium.

In another embodiment of Component (1), reactant (ii), the polymer comprising substituted or unsubstituted hydroxystyrene and acrylate, methacrylate, the hydroxystyrene repeat unit is suitably the para or meta isomer and can be substituted with various substituents which do not interfere with the lithographic utility of the polymer such as halogens, methoxy, or lower alkyl (e.g. methyl or ethyl). Repeat units derived from α-methyl hydroxystyrene can also be used in the polymer herein reactant (ii). In yet another embodiment of reactant (ii), the ester group of the acrylate or the methacrylate is an acid labile group which inhibits the dissolution of the polymer in alkaline developer or polar solvent. The ester group is cleaved by a photoacid generator and/or a post exposure bake and it is converted from a dissolution inhibiting ester to a base soluble organic acid functionality thereby enabling image development of the composition. The acrylate or methacrylate can be provided with a variety of t-butylester or other activated ester groups which are well known to the skilled artisan which contain a tertiary carbon atom next to the oxygen atom of the ester bond, which can also be described as an acid labile group that requires a high activation energy for deblocking than an acetal or ketal group. These high activation protecting energy groups for carboxylic acid when present in a polymer film will not undergo deprotection in areas exposed to radiation where photoacid from Component (4), the PAG, is present until the film is baked in a post-exposure bake. In contrast low activation energy, such as acetal protecting groups, will undergo cleavage in the film upon exposure to the photoacid even before any post exposure bake. In making Component (1) it is very important to do so in the total absence of an acid catalyst. This is because, the use of an acid catalyst in a solution making Component (1) would cause the acrylate, methacrylate or mixtures thereof to become deblocked during the reaction, resulting in an unwanted products and also ultimately may cause sufficient deprotection of the carboxylic acid to occur to render the polymer insoluble in typical spin casting solvent, but also maintain that the dissolution of the reaction product, Component (1), in one preferred embodiment has a dissolution rate less than 30 Å/second in 0.26 N tetramethylammonium hydroxide (TMAH). In another embodiment of this aspect of the invention the dissolution rate is less than 5 Å/second in 0.26 N TMAH.

In another embodiment of this invention, Component (1), reactant (ii), the polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, is selected from one having formula (VI) where $R_7$ is hydrogen or a $C_1$ to $C_4$ alkyl, $R_8$ is an acid labile group that requires a high activation energy for deblocking, and x', and z' are the mole % of each type of repeat unit, where x' is equal to about 55 to about 65 mole %, and z is equal to about 35 to about 45 mole %, where the sum of x' and z' is equal to 100 mole %:

In another embodiment of this aspect of the invention in formula (VII) The $R_7$ is methyl, and $R_8$ is tert-butyl.

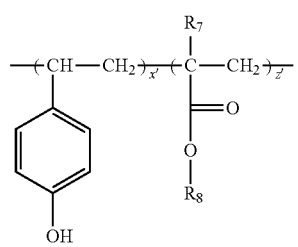

(VI)

In another embodiment of this invention, Component (1), the reaction product is formed with a reactant (iii) which selected from a vinyl ether. The vinyl ether used herein has the formula (VII) where $R_6$ is unsubstituted or substituted alkyl or unsubstituted or substituted cycloalkyl. Examples of vinyl ethers include ethyl vinyl ether, butyl vinyl ether, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, dimethylaminoethyl vinyl ether, diethylaminoethyl vinyl ether, butylaminoethyl vinyl ether, tetrahydrofurfuryl vinyl ether, and the like, etc. In one preferred embodiment, the reaction product, Component 1) has a dissolution rate less than 30 Å/second in 0.26 N tetramethylammonium hydroxide (TMAH). In another embodiment of this aspect of the invention the dissolution rate is less than 5 Å/second in 0.26 N TMAH.

In another manifestation of this embodiment the vinyl ether has the formula (VII) where $R_6$ is an unsubstituted or substituted alkyl or an unsubstituted or substituted cycloalkyl. In yet another embodiment the vinyl ether is ethyl vinyl ether.

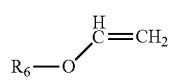

(VII)

In another embodiment of this aspect of the invention in formula (VII) x' is about 60 mole % and z' is about 40 mole %.

In another embodiment of this invention, Component (1), the reaction product, is formed with a reactant (iii) which is an unsaturated heteroalicyclic having formula (VIII) where X' is a heteroatom selected from O or S. Y' is either a direct valent bond or an alkylene moiety such as methylene or ethylene. Rx and Ry are hydrogen, a monovalent substituent such as $C_1$ to $C_8$ alkyl. Furthermore, it is anticipated that Rx and Ry may be connected through to form a secondary alicyclic moiety attached to formula (VII). In one embodiment of this aspect of the inventive composition the unsaturated heteroalicylic moiety is 3,4-dihydro-2H-pyran.

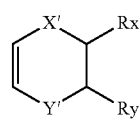

(VIII)

In another embodiment of this invention, Component (2) the heterocyclic thiol compound is selected from the group consisting of unsubstituted triazole thiol, substituted triazole thiol, unsubstituted imidazole thiol, substituted imidazole thiol, substituted triazine thiol, unsubstituted triazine thiol, a substituted mercapto pyrimidine, unsubstituted mercapto pyrimidine, a substituted thiadiazole-thiol, unsubstituted thiadiazole-thiol, substituted indazole thiol, unsubstituted indazole thiol, tautomers thereof, and combinations thereof.

In yet another embodiment, Component (2), the heterocyclic thiol compound is selected from the group consisting of 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomer's thereof and combinations thereof.

In another embodiment of this invention, Component (3), comprises a polymer comprised of formula (V) is one where z and w are both 0 and this Component has formula IX where $R_1$ is an unsubstituted or substituted alkyl or unsubstituted or substituted cycloalkyl, and x, and y, and z are the mole % of each type of repeat unit where x" is equal to about 30 to about 40 mole %, y" is equal to about 60 to about 70 mole %, and where the sum of x", and y" is 100 mole. In another aspect of this embodiment where $R_1$ is methyl. %: In another embodiment of this aspect of the invention $R_1$ is a $C_1$ to $C_8$ alkyl.

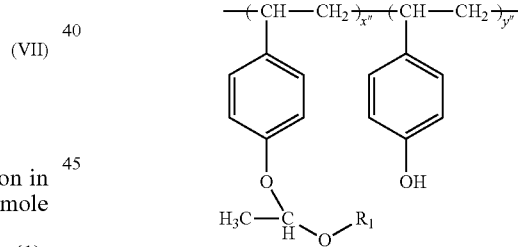

(IX)

In another embodiment of this invention, Component (3), comprises a polymer comprised of formula (V), is one where w is 0 and this component has formula X, where $R_1$ is an unsubstituted or substituted alkyl or unsubstituted or substituted cycloalkyl. $R_2$ is hydrogen or a $C_1$ to $C_4$ alkyl, $R_3$ is a $C_1$ to $C_4$ alkyl or a $C_2$ to $C_4$ alkylenehydroxy moiety and x''', y''', and z''' are the mole % of each type of repeat unit where x''' is equal to about 30 to about 40 mole %, y''' is equal to about 60 to about 70 mole %, z''' is equal to about 2 to about 10 mole %, where the sum of x''', y''' and z''' is equal to 100 mole % and z''' does not exceed about 10 mole %. %: In another embodiment of this aspect of the invention $R_1$ is a $C_1$ to $C_8$ alkyl. In a further embodiment of this aspect of the invention $R_1$ and $R_2$ are methyl and $R_3$ is a $C_1$ to $C_4$ alkyl.

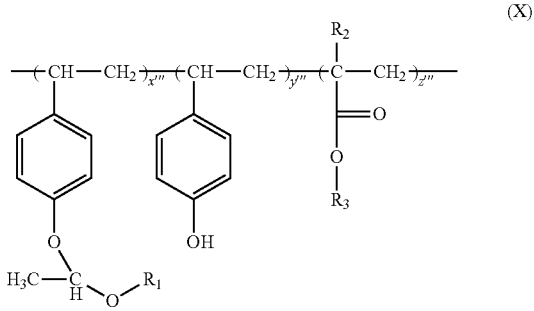

(X)

In another embodiment of this invention, Component (3), comprises a polymer comprised of formula (V), is one where z is 0, and this component has formula XI, where $R_1$ is an unsubstituted or substituted alkyl or unsubstituted or substituted cycloalkyl, $R_2$ is hydrogen or a $C_1$ to $C_4$ alkyl, $R_3$ is a $C_1$ to $C_4$ alkyl or a $C_2$ to $C_4$ alkylenehydroxy moiety and x'''', y'''', and w'''' are the mole % of each type of repeat unit where x'''' is equal to about 30 to about 40 mole %, y'''' is equal to about 60 to about 70 mole %, w'''' is equal to about 1 to about 10 mole %, where the sum of x'''', y'''' and w'''' is equal to 100 mole % and w'''' does not exceed about 10 mole %:

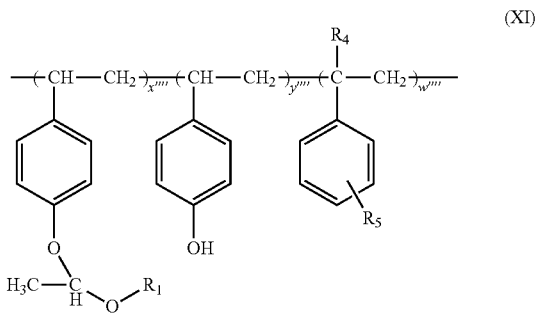

(XI)

In another embodiment of this invention, Component (4), the photo acid generator (PAG), is any compound capable of producing a strong acid (i.e. pKa equal to or smaller than about −1) in a resist film upon irradiation between about 365.4 nm and about 578.2 nm. The photo generated acid deprotects the alkali insoluble polymer of the novel photoresist to give a resist film which is now soluble in an alkaline developer such as 0.26 N tetramethylammonium hydroxide in the exposed regions. Any PAG may be used which generates a strong acid at these wavelengths may be used. One non limiting example of a type of acid which may be photo generated are sulfonic acids. Suitable examples of acid generating photosensitive compounds include, any ionic photo acid generators (PAG), such as diazonium salts, iodonium salts, sulfonium salts, or non-ionic PAGs such as diazosulfonyl compounds, sulfonyloxy imides, nitrobenzyl sulfonate esters, and imidosulfonates, that is either capable of photo generating inherently by being itself absorbing between about 365.4 nm and about 578.2 nm or through the intermediacy of a sensitizer additive in the resist Formulation absorbing between these wavelengths. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluoromethane sulfonate, triphenylsulfonium nonafluorobutane sulfonate and the like. Other useful onium salts such as those disclosed in U.S. patent applications with U.S. Pat. No. 6,991,888 B2, US 2004/02465733 A1, U.S. Pat. No. 7,358,408 B2, and US 2005/0271974 A1, and are incorporated herein by reference. Other compounds that form an acid upon irradiation that may be used are triazines, oxazoles, oxadiazoles, thiazoles, and substituted 2-pyrones. PAGS such as those described in US 2002/0061464 A1 are also useful. Phenolic sulfonic esters, trichloromethyltriazines, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide, N-hydroxynaphthalimide triflate, and their homologues are also possible candidates.

Other examples of photoactive compounds include as non-limiting examples compounds having formulas XIIa-XIIf, where $R_{21}$-$R_{23}$ are independently ($C_1$ to $C_8$)alkyl or ($C_1$ to $C_8$)alkoxy substituents, $X^-$ is a sulfonate counterion, n=1-20, and $R_{20}$ is independently selected from ($C_1$ to $C_8$)alkyl, ($C_1$ to $C_8$)alkoxy, phenyl, styrylphenyl, ($C_1$ to $C_8$)alkoxy-styrylphenyl, furylethylidene, ($C_1$ to $C_8$)alkyl substituted furylethylidene, naphthyl, ($C_1$ to $C_8$)alkyl or ($C_1$ to $C_8$)alkoxy substituted naphthyl.

In embodiments in which a sensitizer is used to supplement Component (4), the PAG, non-limiting examples of suitable sensitizers are anthracenemethanol, pyrene, 1-pyrenemthanol 1-pyrenebutanol. In another embodiment, of this invention, Component (4), the photoacid generator (PAG), may be a mixtures of photoactive compounds; for example, a mixture of a triazine and an imide.

In another embodiment, of this invention, Component (4), the photoacid generator (PAG), may be incorporated in a range from 0.1 to 10 wt % by solids, further from 0.3 to 5 wt % by solids, and further 0.5 to 2.5 wt % by solids.

In another embodiment of this invention, Component (4), the photoacid generator, is selected from the group consisting of diazonium salts, iodonium salts, a sulfonium salts, diazosulfonyl compounds, sulfonyloxy imides, nitrobenzyl sulfonate esters, and imidosulfonates.

In another embodiment of this invention, Component (4), comprising the photoacid generator, Component (4), the photoacid generator is selected from the group consisting of sulfonyloxy imides. In a further embodiment of this aspect of the invention, the photoresist composition the photoacid generator is a sulfonyloxy imide selected from the ones having formula (XII) where $R_9$ is selected from the group consisting of a perfluoroalkyl, a partially fluorinated alkyl, a perfluoro(alkyloxyalkylene), a perfluoro(alkyl)alkylene, a partially fluorinated(alkyl) alkylene, a partially fluorinated (alkyleneoxyalkylene), an alkyl, an alkylalkylene, a substituted alkylalkylene, an aryl, a perfluoroaryl, and a partially fluorinated aryl; $R_{10}$ to $R_{15}$ are independently selected from the group consisting of hydrogen, an alkyl, a perfluoroalkyl, a partially fluorinated alkyl, an alkoxy, an alkoxyalkylene (-alkylene-O-alkyl), an alkoxyalkyleneoxy (—O—alkylene-O-alkyl), a thioalkoxy, and an alkenyl (i.e. —CH═CH—Rp) where the Rp group may be an alkyl, a carbonyloxyalkyl (—C═O—O-alkyl), or an aryl (e.g. phenyl).

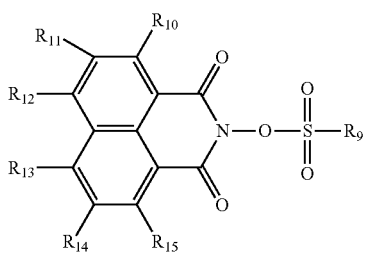

PAG's having structures XIIa, XIIb, XIIc, XIId, XIIe, XIIe and XIIg that do not have substituents allowing to absorb and generate acid photochemically, at wavelengths in the range of about 365.4 nm to about 578.2 nm, inherently, must be used in conjunction with an appropriate sensitizer, as described herein.

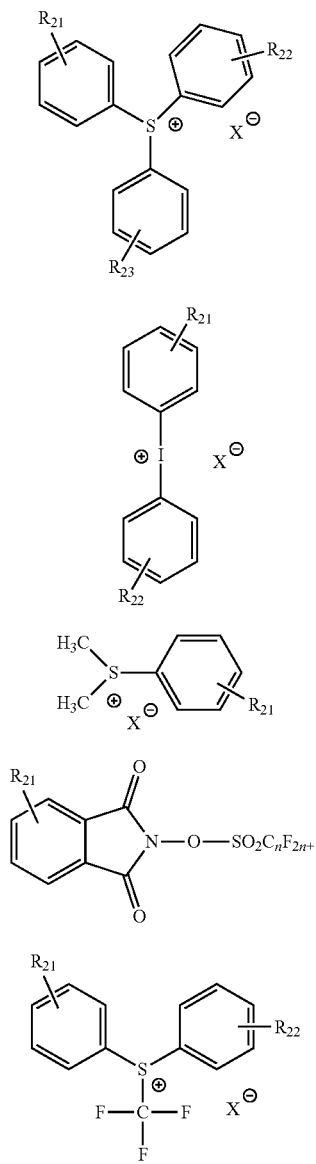

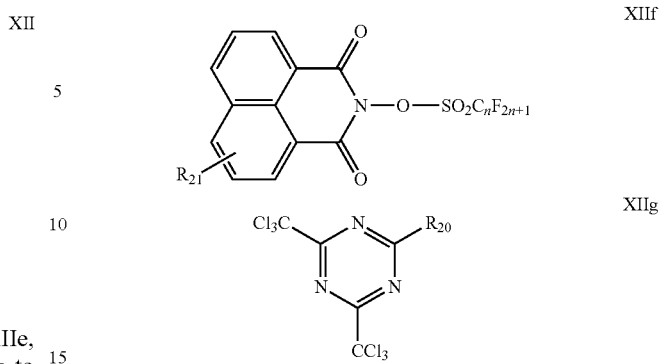

In one embodiment, the PAG of structure (XII) has at least one substituent $R_{10}$ to $R_{15}$ which is selected from a substituent that imparts either i-line or broadband sensitivity toward the photo-generation of acid to the PAG selected from groups such as a thioalkoxy, or an substituted alkenyl (i.e. —CH=CH—Rp) where the Rp group may be an alkyl, a carbonyloxyalkyl (—C=O—O-alkyl), or an aryl (e.g. phenyl).

As non-limiting examples the PAG may be chosen from ones having specific structures such as the ones in Structures XIIh, XIIi, XIIj, XIIk, XIII, XIIm, and XIIn, or combination of these specific PAG's. Of these XIIh represent a structure of a PAG which by itself in not i-line or broadband sensitive but which may be sensitized by the addition of a suitable sensitizer such as 9-anthracenemethanole. For the other specific structures of PAG's XIIi, XIIj, XIIk, XIII, XIIm, and XIIn, which are i-line sensitive or broad band PAG's, the need of a sensitizer is optional.

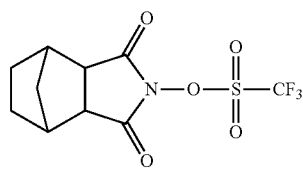

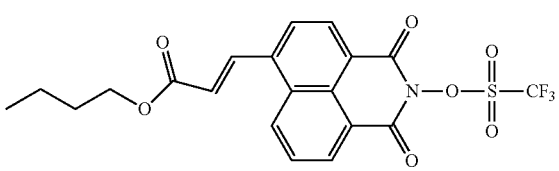

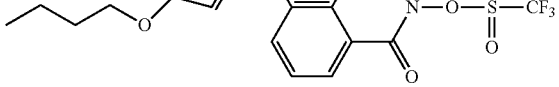

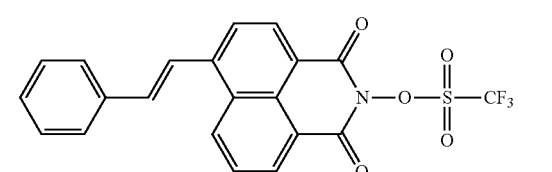

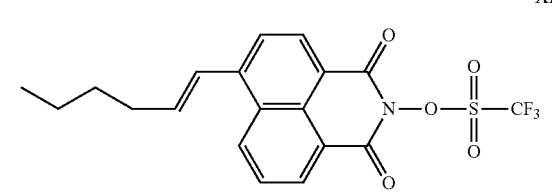

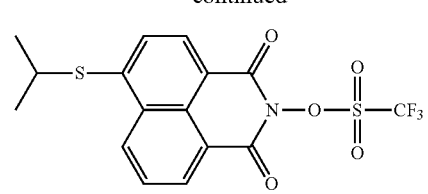 XIII

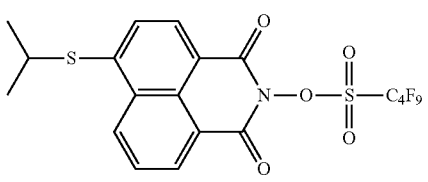 XIIm

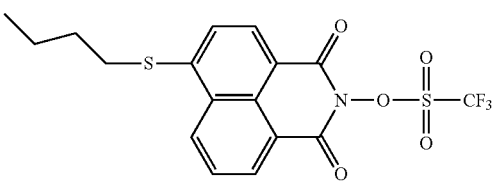 XIIn

In another embodiment of this invention, Component (5), the base additive, this base additive may be added at levels from about 0.01 wt % to about 5 wt % of solids, further up to 1 wt % of solids, and more further to 0.07 wt % of solids.

Examples of nitrogen containing bases include amines, such as triethylamine, triethanolamine, aniline, ethylenediamine, pyridine, tetraalkylammonium hydroxide or its salts (for example, tetramethylammonium hydroxide, tetramethylammonium acetate, tetrabutylammonium hydroxide, tetrabutylammonium acetate). Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (e.g. $CF_3CO_2^-$) or nucleophilic acids (eg $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

In another embodiment of this invention, for Component (5), may comprise nonvolatile amine additives. Examples of amines would be ones having a sterically hindered structure so as to hinder nucleophilic reactivity while maintaining basicity, low volatility and solubility in the resist Formulation, such as a proton sponge, 1,5-diazabicyclo[4.3.0]-5-nonene, 1,8-diazabicyclo[5,4,0]-7-undecene, cyclic akylamines, or polyether bearing amines such as described in U.S. Pat. No. 6,274,286.

In another embodiment of this invention, Component (5), the base, it may comprise a nitrogen containing base selected from the group consisting of a trialkylamine, a tri(hydroxyalkylene)amine, an N-alkyl di(hydroxalkylene)amine, a di(hydroxalkylene)amine, an N,N-dialkyl (hydroxalkylene) amine, an (hydroxalkylene)amine, an analine, an N-alkyl aniline, an N,N-dialkyl aniline, an alkylenediamine, an N-alkyl alkylenediamine, an N, N-dialkyl alkylenediamine, an N, N, N'-trialkyl alkylenediamine, an N, N, N',N'-tetraalkyl alkylenediamine, a pyridine derivative, a tetraalkylammonium hydroxide, and a tetramethylammonium alkylcarboxylate.

In another embodiment of this invention, for Component (6), the optional adhesion promoter, is selected from a polyvinyl alkyl ether polymer.

In another embodiment of this invention, for Component (6), the adhesion promoter, is a polyvinyl alkyl ether where the alkyl group is selected from a $C_1$ to $C_4$ alkyl group.

In another embodiment of this invention, for Component (6), the polyvinyl ether alkyl ether adhesion promoter, is selected from a materials such as Lutonal®.

In another embodiment of this invention, for Component (6), the optional adhesion promoter, is selected from a polyvinyl alkyl ether polymer comprising a structure (XIIa) where Alk designates a $C_1$ to $C_4$ alkyl moiety and vr is a non-zero integer designating the number of alkyl vinyl repeat units.

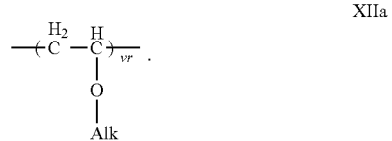 XIIa

In another embodiment of this invention Alk in structure (XII) is methyl or ethyl.

In another embodiment of this invention, alky in structure (XII) is methyl.

In another embodiment of this invention, for Component (6), the optional adhesion promoter, is selected from a Novolak.

In another embodiment of this invention, for Component (6), the optional adhesion promoter, is a Novolak selected independently from the ones described previously as one of the reactant component, reactant i), used in making Component (1).

For instance, in a non-limiting example, Component (6) may be selected from an alkali-soluble, film forming Novolak resins include phenol-formaldehyde Novolaks, cresol-formaldehyde Novolaks, and phenol-modified xylenol-formaldehyde Novolaks. Novolak resins have been commonly used in the art of photoresist manufacture as exemplified by "Chemistry and Application of Phenolic Resins", Knop A. and Scheib, W.; Springer Verlag, N.Y., 1979 in Chapter 4. In a more specific embodiment of this aspect of the invention the Novolak is selected from a cresol-formaldehyde Novolak.

Another more specific non-limiting example Component (6) may be selected from a cresol formaldehyde Novolak.

Another more specific non-limiting example of Component (6) may be may be selected from a cresol formaldehyde Novolak such as an m-cresol/formaldehyde Novolak such as SPN-560 F or SPN-560 S, produced by Allnex, Brussels, Belgium.

In another embodiment of this invention, for Component (7), the solvent is used in producing the photoresist composition, by dissolving the solid components of the photoresist (i.e. Components 1-5, optionally Component 6 and any other optional Components) are mixed with the solvent Component (7) which is a single solvent or a mixture of solvents that dissolve the solid Components of the photoresist. Suitable solvents the novel composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methylpyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

In another embodiment of this invention, for Component (7), the solvent is selected from the group consisting of a glycol ether derivative, a glycol ether ester derivative a carboxylate, a carboxylate of a di-basic acid, a dicarboxylate of a glycol, a hydroxy carboxylate, a ketone ester; an alkoxycarboxylic acid ester a ketone derivative, a ketone ether derivative, a ketone alcohol derivative, an amide derivative, and mixtures thereof.

In another Embodiment, of the novel photoresist composition Component (7), the solvent, ranges from about 50 wt % to about 80 wt % of total the total weight of the photoresist composition. In another aspect of this embodiment the invention, Component (7) ranges from about 55 wt % to about 75 wt % of the total resist solution. In yet more specific embodiment of the novel photoresist composition, Component (7) ranges from about 60 to about 65 wt % of the total weight of the total photoresist composition. In another mores specific embodiment, Component (7), ranges from about 60 to about 65 wt % of the total weight of the total photoresist composition.

Of the solid components, the solid component, Component (1), ranges from about 15 to about 80 wt % of total solids. In another embodiment of this aspect of the invention, Component (1) ranges from about 25 to about 65 wt % of total solids. In a further aspect of this embodiment, Component (1) ranges from about 40 to about 65 wt % of total solids. In a further aspect of this embodiment, Component (1) ranges from about 45 to about 65 wt % of total solids.

Of the solid components, the solid component, Component (2) ranges from about 0.02 to about 1 wt % of total solids. In another aspect of this embodiment, Component (2) ranges from about 0.02 to about 0.07 wt % of total solids. In a further embodiment of this aspect, Component (2) ranges from about 0.02 to about 0.05 wt % of total solids. In a further embodiment of this aspect, Component (2) ranges from about 0.02 to about 0.04 wt % of total solids.

Of the solid components, the solid component, Component (3) ranges from about 20 to about 85 wt % of total solids. In another embodiment of this aspect of the invention, Component (3) ranges from about 35 to about 75 wt % of total solids. In a further embodiment of this aspect, Component (3) ranges from about 30 to about 60 wt % of solids. In a further embodiment of this aspect, Component (3) ranges from about 30 to about 45 wt % of total solids.

Of the solid components, the solid component, Component (4) ranges from about 0.4 to about 2.5 wt % of total solids. In another embodiment of this aspect of the invention, Component (4) ranges from about 0.6 to about 2.0 wt % of total solids. In a further aspect of this embodiment, Component (4) ranges from about 0.8 to about 1.95 wt % of total solids. In a further aspect of this embodiment, Component (4) ranges from about 1.1 to about 1.9 wt % of total solids.

Of the solid components, Component (5) ranges from about 0.05 to about 0.4 wt % of total solids. In another embodiment of this aspect of the invention Component (5) ranges from about 0.05 to about 0.25 wt % of total solids. In a further aspect, Component (5) ranges from about 0.1 to about 0.2 wt % of total solids.

Of the solid components, Optional Component (6) ranges from about 0 to about 15 wt % of total solids. In another embodiment of this aspect of the invention Component (6) ranges from about 0 to about 10 wt % of total solids. In a further embodiment of this aspect of the invention, Component (6) ranges from about 0 to about 5 wt % of total solids.

In another Embodiment, of the novel photoresist composition Component (7), the solvent, ranges from about 50 wt % to about 80 wt % of total the total weight of the resist solution. Of the solid components, Component (1) ranges from about 15 to about 80 wt % of total solids, Component (2) ranges from about 0.02 to about 1 wt % of total solids, Component (3) ranges from about 20 to about 85 wt % of total solids. Component (4) ranges from about 0.4 to about 2.5 wt % of total solids, Component (5) ranges from about 0.05 to about 0.4 wt % of total solids, and Component (6) ranges from about 0 to about 15 wt % of total solids, In another Embodiment, of the novel photoresist composition Component (7), the solvent, ranges from about 55 wt % to about 75 wt % of the total resist solution. Of the solid components, Component (1) ranges from about 25 to about 65 wt % of total solids, Component (2) ranges from about 0.02 to about 0.07 wt % of total solids, Component (3) ranges from about 35 to about 75 wt % of total solids. Component (4) ranges from about 0.6 to about 2.0 wt % of total solids, Component (5) ranges from about 0.05 to about 0.25 wt % of total solids, and Component (6) ranges from about 0 to about 10 wt % of total solids.

In yet more specific embodiment of the novel photoresist composition, Component (7), which is the solvent, ranges from about 60 to about 65 wt % of the total weight of the total composition. Of the solid components, Component (1) ranges from about 40 to about 65 wt % of total solids, Component (2) ranges from about 0.02 to about 0.05 wt % of total solids, Component (3) ranges from about 30 to about 60 wt % of solids. Component (4) ranges from about 0.8 to about 1.95 wt % of total solids, Component (5) ranges from about 0.1 to about 0.2 wt % of total solids, and Component (6) ranges from about 0 to about 5 wt % of total solids.

In another mores specific embodiment, Component (7), ranges from about 60 to about 65 wt % of the total weight of the total composition; Component (1) ranges from about 45 to about 65 wt % of total solids, Component (2) ranges from about 0.02 to about 0.04 wt % of total solids, Component (3) ranges from about 30 to about 45 wt % of total solids. Component (4) ranges from about 1.1 to about 1.9 wt % of total solids, Component (5) ranges from about 0.1 to about 0.2 wt % of total solids, and Component (6) ranges from about 0 to about 2.5 wt % of total solids.

In any aspect of the compositions of this novel photoresist, described above, and herein, where component (6) is given a range where the lowest amount of Component (6) starts with an amount of about 0 wt %, it is anticipated that when Component (6) is actually present and not about 0 wt % this component may range from about 2 to about 15 wt % of total solids. In another embodiment of this aspect of the invention, Component (6) ranges from about 2 to about 10 wt % of total solids. In a further embodiment of this aspect, Component (6) ranges from about 2 to about 5 wt % of total solids. In a further embodiment of this aspect, Component (6) ranges from about 2 to about 2.5 wt % of total solids.

In any aspect of the composition of this novel photoresist, described above and herein, it is required that the total wt % of the solid components (1), (2), (3), (4), (5), and (6) is equal to 100%.

The copolymer described herein, such as those described for reactant ii) in Component (1), a polymer comprising substituted or unsubstituted hydroxystyrene and acrylate, methacrylate, or a mixture of acrylate and methacrylate, the acrylate and/or methacrylate being protected by an acid labile group that requires a high activation energy for deblocking, can be prepared by standard radical copolymerization to yield random copolymers. As a non-limiting example, for making a material described by formula (V) t-butyl methacrylate can be copolymerized with (i) p-tert-butoxycarbonyloxystyrene (a hydroxystyrene precursor monomer) with subsequent thermal cleavage or mild acidolysis of the t-butoxycarbonyl group to form p-hydroxystyrene/t-butyl methacrylate copolymer or (ii) with p-t-butyl (dimethyl)silyloxystyrene with subsequent desilylation with fluoride. Alternatively, acetoxystyrene is copolymerized with acrylate or methacrylate. Generally acetoxystyrene is mixed under nitrogen at an elevated temperature of about 50° to 100° C. with the ester monomer in a suitable solvent such as toluene or THF, along with a small amount of a free radical catalyst such as benzoyl peroxide. The product polymer poly(acetoxystyrene-co-acrylate) is then deacylated with mild base (e.g. dimethylaminopyridine, ammonium hydroxide, carbonate or bicarbonate) in a nonaqueous solvent such as an alcohol solvent (methanol or propanol) to form the hydroxystyrene/acrylate copolymer which in this non limiting example belongs to the group of materials having formulat (VI).

In one embodiment of this invention the above copolymer for reactant ii) in Component (1) can contain the hydroxystyrene unit in the range of 50 to 90 mol %, depending on the desired dissolution rate/sensitivity. The copolymer typically has a number-average molecular weight (Mn) (relative to polystyrene standard) ranging from 7,000 to 50,000. The copolymer has a high glass transition temperature of about 120° C. to about 170° C. The copolymer also has a high acid sensitivity. This enables a high pre-exposure heating of a film of the composition which results in substantially improved lithographic performance.

Similarly, suitable polymers for comprising Component (3) such as those having formulas (V), (IX), (X) or (XI) may be prepared by first preparing a polymeric precursor having formulas (Va), (IXa), (Xa) or (XIa) having free phenolic moiety. The synthesis of this precursors is done in a manner analogs to what has been described for reactant (i) by radical polymerization and using protected version of a styrene phenol monomer to affect the polymerization as described above followed by deprotection after polymerization to form the free styrene phenol repeat unit, as described above. This protected styrene phenol may be polymerized by itself yielding after deprotection a polymer having formula (IXa) or alternatively copolymerized with a monomers having structure (Vb) and or (Vc) to give after deprotection either polymeric precursors having structures (Va), (Xa), or (XIa).

In these structures $R_2$, $R_3$, $R_4$ and $R_5$ are as previously described for formula (V); and in structure (Va) the sum of y+x+z+w is equal to 100 mole %, in structure (IXa) the sum of y"+x" is equal to 100 mole %, in structure (Xa) the sum of y'''+x'''+z''' is equal to 100 mole %, and in structure (XIa) the sum of y''''+x''''+w'''' is equal to 100 mole %. As an example, the term y+x (or corresponding y", y''', y'''', x", x''', x'''' terms) represent the total mole % of hydroxystyrene where x (x", x''', x'''') is 30 to 40%, the amount which will be protected by an acetal moiety and y (y", y''', y'''') is the amount which will remain free. The formation of the final polymer formulas (V), (IX), (X) or (XI) may be done by reacting these polymeric precursors under conditions for acetal formation with a vinyl ether. Examples of vinyl ethers include ethyl vinyl ether, butyl vinyl ether, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, dimethylaminoethyl vinyl ether, diethylaminoethyl vinyl ether, butylaminoethyl vinyl ether, tetrahydrofurfuryl vinyl ether, and the like, etc. In another manifestation of this synthesis the vinyl ether may be a vinyl ether having structure (Vd) where $R_1$ is an unsubstituted or substituted alkyl or unsubstituted or substituted cycloalkyl. In yet another manifestation of this synthesis $R_1$ is a $C_1$ to $C_8$ alkyl. In yet another embodiment the vinyl ether is ethyl vinyl ether. This synthesis may be accomplished by reacting the polymeric precursors, for instance the ones having formula (Va) (Xa), (IXa) or (XIa), in solution with a vinyl ether with an acid catalyst.

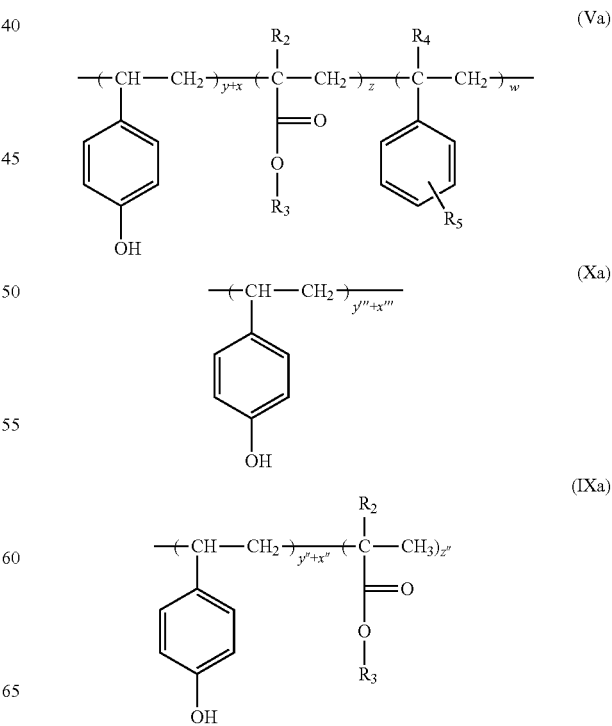

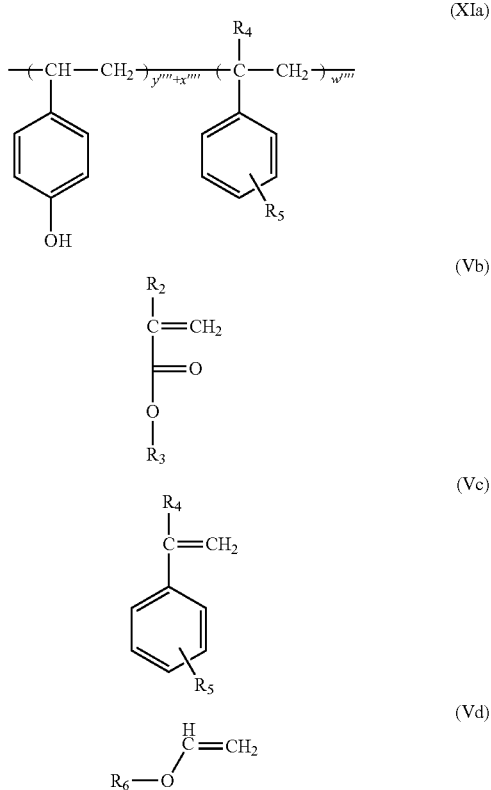

The inventive Formulation herein may contain other Components apart from Components (1) to (7) such as additives, surfactants, dyes, plasticizers, and other secondary polymers. Surfactants are typically compounds/polymers containing fluorine or silicon compounds which can assist in forming good uniform photoresist coatings. Certain types of dyes may be used to provide absorption of unwanted light. Plasticizers may be used, especially for thick films, to assist in flow properties of the film, such as those containing sulfur or oxygen. Examples of plasticizers are adipates, sebacates and phthalates. Surfactants and/or plasticizers may be added at concentrations ranging from 0.1 to about 10 wt % by total solids in the photoresist composition.

The prepared photoresist composition solution, can be applied to a substrate by any conventional method used in the photoresist art, including dipping, spraying, whirling and spin coating. When spin coating, for example, the resist solution can be adjusted with respect to the % age of solids content, in order to provide coating of the desired thickness, given the type of spinning equipment utilized and the amount of time allowed for the spinning process. Suitable substrates include, without limitation, silicon, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds.

The photoresist coatings produced by the described procedure are particularly suitable for application to copper coated wafers, such as are utilized in the production of microprocessors and other miniaturized integrated circuit Components. A silicon/silicon dioxide wafer can also be used. The substrate may also comprise various polymeric resins, especially antireflective coatings. The substrate may have an adhesion promoted layer of a suitable composition, such as one containing hexa-alkyl disilazane.

The photoresist composition solution is then coated onto the substrate, and the substrate is treated at a temperature from about 70° C. to about 150° C. for from about 30 seconds to about 6 minutes on a hot plate or for from about 15 to about 90 minutes in a convection oven. This temperature treatment is selected in order to reduce the concentration of residual solvents in the photoresist, while not causing substantial thermal degradation of the photoabsorbing compounds. In general, one desires to minimize the concentration of solvents and this first temperature treatment is conducted until substantially all of the solvents have evaporated and a coating of photoresist composition, on the order of 2-200 microns (micrometer) in thickness, remains on the substrate. Multiple coatings may be done to achieve thick films. The temperature is from about 95° C. to about 135° C. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm (nanometers) to about 450 nm, x-ray, electron beam, ion beam or laser radiation, in any desired pattern, produced by use of suitable masks, negatives, stencils, templates, etc. Generally, thick photoresist films are exposed using broadband radiation, using equipment such as Ultratech, Karl Suss or Perkin Elmer broadband exposure tools, although 436 nm and 365 nm Steppers may also be used.

The photoresist is then optionally subjected to a post exposure second baking or heat treatment either before or after development. The heating temperatures may range from about 90° C. to about 150° C., further from about 90° C. to about 130° C. The heating may be conducted for from about 30 seconds to about 3 minutes, further from about 60 seconds to about 2 minutes on a hot plate or about 30 to about 45 minutes by convection oven.

The exposed photoresist-coated substrates are developed to remove the image-wise exposed areas by immersion in a developing solution or developed by spray development process. The solution is can be agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One example of a hydroxide is tetramethyl ammonium hydroxide. Other include bases are sodium or potassium hydroxide. Additives, such as surfactants, may be added to the developer. After removal of the coated wafers from the developing solution, one may conduct an optional post-development heat treatment or bake to increase the coating's adhesion and density of the photoresist. The imaged substrate may then be coated with metals, or layers of metals to form bumps as is well known in the art, or processed further as desired.

Another aspect of this invention is a novel coated substrate comprising: a substrate having thereon a coating layer of the novel photoresist formed on the substrate.

Another aspect of this is invention is a novel method for forming a photoresist relief image on a substrate comprising the steps of (a) to (b) where step (a) is applying on a substrate a layer of the novel photoresist composition described herein and step (b) comprises exposing the photoresist layer to activating radiation and developing the exposed photoresist layer.

The thickness of a coating film formed by the novel photoresist composition described herein can be greater than 2 microns with photoresist films as thick as 80 microns being imaged. The photoresist is useful for imaging photoresist films on several types of substrates, for example, copper substrates requiring an aspect ratio of greater than 3 (aspect ratio is the ratio of height to width of the photoresist pattern). In another embodiment the thickness range may be 2 to 20 microns.

The following examples provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

General Formulation Procedure for Formulations.

Formulations (1) to (8) in Table 1 where prepared as follows:
The Formulation examples provided in table 1 were prepared by dissolving the amounts of each Component given in the table for each Formulation in PGMEA solvent. The solvent amount used in each sample is calculated to add up to a total of 100 gm of each sample. Thus the solids content of each sample given in the table represent the total wt of all Components of each sample except the solvent. The amount of PGMEA used in each sample would thus equal (100–solids): wt of solvent=[100–(% solids)] gm.

General Processing Conditions for Formulations

The resist pattern for Formulations described in Table 1, whose imaging performance with post exposure delay (PED) is shown in FIGS. 1 and 2, can be produced by the usual photoresist process. The resist solution is spin coated on the wafer at appropriate spin speed to produce the desired film thickness and film uniformity. A soft bake step is applied to drive most of the solvent out of the coating. The soft bake temperature used is 110° C. for 120 seconds. The dry coating is then exposed to a patterned image, a post-exposure baked at a relatively low temperature (90° C.) may be used, but not essential. Then the resist is developed with standard AZ®-300MIF developer (EMD Performance Materials, AZ Products, Somerville, N.J.0

High aspect ratio patterns, greater than 5:1 were produced with vertical sidewall profiles on Cu substrates at 5 μm thick resist films, resolving 0.9 μm equal line/spaces. Table 1 below provides the wt % composition of Components in the Formulations.

Table 1 provides Formulation examples of the best Formulations as well as comparative Formulation examples whose Formulation numbers are shown in the first column all of which are dissolved in PGMEA the amount in wt % is designated in column 2.

In column 3 of Table 1, the term "Acetal/PVP" designates a partially ethyl vinyl ether acetal blocked polyvinylphenol also called EE-polyhydroxystyrene (PHS). The entries in the "Acetal/PVP" column in Table 1 designated by "W" were polymers produced by Wako Pure Chemical Industries, Ltd, (a.k.a. Wako), Richmond Va., the while the entry designated "DH" were produced by Heraues Daychem (Vandalia, Ohio) starting from a polyhydroxystyrene from E. I. du Pont de Nemours and Company, (a.k.a DuPont) which was acetal blocked with ethyl vinyl ether by Heraues; Table 2 outlines the Molecular weight properties (a.k.a. the Weight average Molecular weight (Mw), Number average Molecular weight (Mn) and the polydispersity (Mw/Mn)) and molar % of protection of phenolic hydroxyl moiety by a ethyl vinyl ether acetal for these two Acetal/PVP materials.

In column 4 of Table 1, the term "CN6" designates the reaction product of a blend of 60% "copolymer (hydroxystyrene/t-BA) (CZ6), and 40% Novolak (SPN-560 F) with ethylvinyl ether to produce acetal-blocking polymer blend made according to Example 1 CN6. The term "CZ6" is a hydroxystyrene/t-BA copolymer containing 60% hydroxystyrene repeat units and 40% tertiarybutylacrylate repeat units having a Mw of 10,000-11,500, and a PD=1.6-1.8) obtained from E. I. du Pont de Nemours and Company, (a.k.a DuPont), Wilmington Del. which was ordered under the name TQ1010.

In column 5 of Table 1, the term "CZ6" is the above described hydroxstyrene/t-BA copolymer from DuPont used as a component in Formulation (5).

This copolymer may also be obtained from (Maruzen) Marula Lyncur (CA-1).

In Columns 6 and 7 of Table 1, the acronyms "NIN" and "NIT" respectively designate the PAG components, N-hydroxy-naphththylimide perfluorobutanesulfonate ester (NIN) and N-hydroxy-naphththylimide triflate (NIT), obtained from Heraues Daychem (Vandalia, Ohio).

In column 8 of Table 1, the acronym "MTA" in designated the heterocyclic thiol compound 1H-1,2,3-triazole-3-thiol from Sigma-Aldrich Corp. (St. Louis, Mo., USA).

\In column 9 of Table 1, the term "DIPA" in Table 1 refers to the base additive, 2,6-Diisopropylaniline, obtained from Sigma-Aldrich Corp. (St. Louis, Mo., USA).

TABLE 1

Showing the Composition of Different Formulations Studied

| Formulation Examples | % solids in PGMEA | Acetal/PVP/ Source % total Solids | CN6 polymer % total Solids | CZ6 polymer % total Solids | NIN PAG % total Solids | NIT PAG % total Solids | MTA % total Solids | DIPA % total Solids | Novolak % total Solids | Lutonal % total Solids | APS-437% total Solids |
|---|---|---|---|---|---|---|---|---|---|---|---|
| (1) | 36.7 | 34.1/W | 60.93 | — | 1.95 | — | 0.025 | 0.197 | 2.74 | — | 0.05 |
| (1a) | 37.0 | 35.12/W | 62.6 | — | 2.00 | — | 0.025 | 0.197 | | | 0.038 |
| (2) | 36.97 | 33.1/W | 61.8 | — | — | 1.787 | 0.024 | 0.174 | 3.05 | — | 0.07 |
| (3) | 38.1 | — | 95.51 | — | — | 1.926 | 0.024 | 0.248 | — | 2.217 | 0.064 |
| (4) | 38 | — | 95.51 | — | — | 1.938 | 0.025 | 0.248 | — | 2.217 | 0.065 |
| (5) | 34.8 | — | — | 95.68 | — | 1.107 | 0.025 | 0.0742 | — | 3.138 | 0.05 |
| (6) | 30.8 | 94.542/W | — | — | — | 1.48 | 0.025 | 0.39 | 3.476 | — | 0.1 |
| (7) | 30.6 | 95.28/W | — | — | 0.993 | — | .0029 | 0.116 | 3.61 | — | 0.04 |
| (8) | 35 | 34.1/DH | 60.93 | — | 1.95 | — | 0.025 | 0.197 | 2.74 | — | 0.05 |

In column 10 of Table 1, the term "Novolak" refers to an optional adhesion component, a Novolak component which was a m-cresol/formaldehyde Novolak (SPN-560 F), produced by Allnex, Brussels, Belgium.

In column 11 of Table 1, the term "Lutonal" refers to an optional polyvinylmethylether polymer adhesion component which was Lutonal® M40, a solid polyvinylmethylether polymer (>95 wt %) from BASF (Ludwigshafen, Germany).

In column 12 of Table 1, the term "APS-437" refers to the optional component, APS-437 from ShinEtsu Chemical Co. LTd, Tokyo, Japan Company).

TABLE 2

Showing the analytical data comparing acetal blocked PHS polymers from different suppliers, Wako and Hereaus/DuPont.

| EE/PVP polymer source | Wako | Hereaus/DuPont |
|---|---|---|
| Mw | 21,297 | 29,622 |
| Mn | 19,548 | 17,694 |
| Mw/Mn | 1.09 | 1.667 |
| % Acetal protected | 34.2 | 35.37 |

Formulation (1)

Four 6" diameter Cu wafers were spin coated with Formulation to provide 5 µm of dry resist coatings. The wafers were baked at 110° C. for 120 seconds. ASML (Chandler, Ariz.) i-line stepper (0.48NA) was used to expose the resist coatings of each wafer with the same dose (100 mJ/cm$^2$). All wafers were then post exposure baked (PEB) at 90° C. for 60 seconds. One wafer was PEB and developed within a few minutes after exposure. The second wafer was PEB and developed 2 hours after exposure. The third wafer was PEB and developed 6 hours after exposure. The fourth wafer was PEB and developed 24 hours after exposure. The delay wafers were kept in an ordinary laboratory environment, under yellow light. All wafers were developed for 2×60 second (two puddles, each for 60 seconds) with AZ® 300MIF developer. The resulting resist patterns cross sections were imaged with scanning electron microscope photos. The results show all wafers to have maintained the same image profiles and dimensions for all features (the smallest line/space patterns resolved were 0.9 µm equal line spaces). FIG. 1 shows these SEM images obtained with Formulation (1) showing that this Formulation provided PED stability up to 24 hours.

Formulation (1a)

This Formulation was very similar in composition to that of Formulation (1) except that it did not contain a Novolak Adhesion promoter as in Formulation (1) or a Lutonal Adhesion promoter. Thus Formulation (1a) does not have any of the optional Component (6) adhesion promoter component. Formulation (1a) was processed in the same manner as Formulation (1), as described above, except that two wafers were employed. One coated wafer, immediately after exposure, was post-exposed baked at 90° C. for 60 second and was then developed with AZ® 300MIF developer for 90 seconds. The second coated wafer was held in a light free environment, after exposure, and then after a 22 hour delay underwent a post-exposure bake at 90° C. for 60 second and was then developed with AZ® 300MIF developer for 90 seconds. The resulting resist patterns cross sections were imaged with scanning electron microscope photos. The results show all wafers to have maintained the same image profiles and dimensions for all features (the smallest line/space patterns resolved were 0.9 µm equal line spaces). FIG. (1a) shows these SEM images obtained with Formulation (1a) showing that this Formulation provided PED stability up to 22 hours.

Formulation (2)

Formulation (2) was processed in a similar manner to Formulation (1). In this case 5 wafers were processed. Each coated wafer was exposed to an exposure matrix ranging from 40 to 100 mJ/cm$^{2'}$ then the wafers were held for the corresponding delay times before PEB and development in the same manner as described for Formulation (1) to give 0, 2 hours, 4 hours, 6 hours and 20 hours of PED. Formulation (2) provided PED stability up to 20 hours but with a 10 mJ/cm$^2$ dose shift from initial dose compared to Formulation (1). Equal line/space patterns were produced using 60 mJ/cm$^2$ dose for all wafers delayed for 2 hours or longer. The initial wafer (no delay) optimum dose was 70 mJ/cm$^2$. Thus an initial hold time after exposure is required. FIG. 2 shows these SEM images obtained with Formulation (2) showing that this Formulation provided PED stability up to 20 hours [excluding the initial hold time (about or less than 2 hours)].

Formulation (3) and Formulation (4)

Formulations (3) and (4) are comparative examples using a blend of blocked polymers containing (high activation blocking group: t-BA) and not including acetal blocked PHS polymer. Their process required a post exposure bake (PEB) prior to development for 60 seconds at 90° C. As shown respectively in FIG. (3), these comparative Formulations showed changes in CD after 4 hours delay (particularly for all features smaller than 1.6 µm) and severe T-top for longer delays (between exposure and PEB) for 7 and 16 hours PED.

Formulation (5) is another comparative example using copolymer of hydroxystyrene/t-BA (60/40) "CZ6," which is a high activation energy blocked polymer, requiring PEB to deblock and develop. This resist shows changes in its patterns CD upon post exposure delay as shown in the Table 3 below. The process conditions for Formulation (5) showing these changes in CD where as follows: Film Thickness: 5.3 µm, SB: 110° C./120 sec, ASML 0.48 NA 0.55 σ i-Line stepper exposure, PEB: 90° C./60 sec Contact, AZ® 300 MIF, 60 sec spray puddle @ 23° C.

TABLE 3

Formulation (5) showing increased line width as a function of PED

| | PED (minutes) | | | | | |
|---|---|---|---|---|---|---|
| | 0 | 15 | 30 | 60 | 150 | 300 |
| Dose to print 5.3 µm 1:1 line/space (mJ/cm$^2$) | 101 | 101 | 102 | 108 | 114 | 115 |

All Formulations (4), (5) and (6), based only on either CN6 or CZ6 polymers, show post exposure delay instability, in the form of increasing line width, T-top patterns and closing of spaces between lines with PED.

Formulation (6)

Formulation (6) is another comparative example using only acetal blocked PHS polymer. This Formulation was processed without the need for post exposure bake (PEB). The initial imaging, without any process delay only resolved 2.0 µm line/spaces at 160 mJ/cm$^2$ where smaller features (1.6 µm-1.2 µm features) did not completely clear the resist from the open spaces. Delayed wafers for 2 hours, 4 hours and 6 hours required only 140 mJ/cm$^2$ dose to completely resolve all features down to 0.8 µm and exhibiting significant line slimming associate with PED times. Samples 2637-65EE and 2637-66A were developed for 2×60 seconds. FIG. (4) shows the poor PED stability of this Formulation.

Formulation (7)

Formulation (7) was formulated with acetal blocked PES polymer only and is another comparative example. It also exhibited line slimming as a function of post exposure delay (PED) as shown in the SEMs and Table 4 below, for nominal 2.0 µm equal line space patterns. This sample did not clear 2 µm lines/spaces at 70 mJ/cm$^2$ initially, but started to clear the spaces between the lines after 2 hours of delay. The lines continued to slim, with top rounding after 4 and 6 hours of delay. The magnitude of line slimming of 2.0 µm lines for sample (Formulation (7)) is less than that observed with sample (Formulation (6)), which may be attributed to the reduced diffusion of its acid, since it was formulated with a larger PAG molecule (NIN PAG). However both samples formulated with acetal blocked PHS only suffered significant changes in line width with post exposure delay.

TABLE 4

Formulation (7) showing line slimming as a function of PED

| Delay Dose | No Delay | 2 hours PED | 4 hours PED | 6 hours PED |
|---|---|---|---|---|
| 70 mJ/cm$^2$ | closed | 1.97 µm | 1.66 µm | 1.86 µm |
| 80 mJ/cm$^2$ | Standing wave | 1.8 µm | 1.9 µm | 1.73 µm |
| 90 mJ/cm$^2$ | 2.0 µm | 1.7 µm | 1.8 µm | 1.67 µm |
| 100 mJ/cm$^2$ | 1.87 µm | 1.7 µm | 1.73 µm | 1.6 µm |

Figure 6:
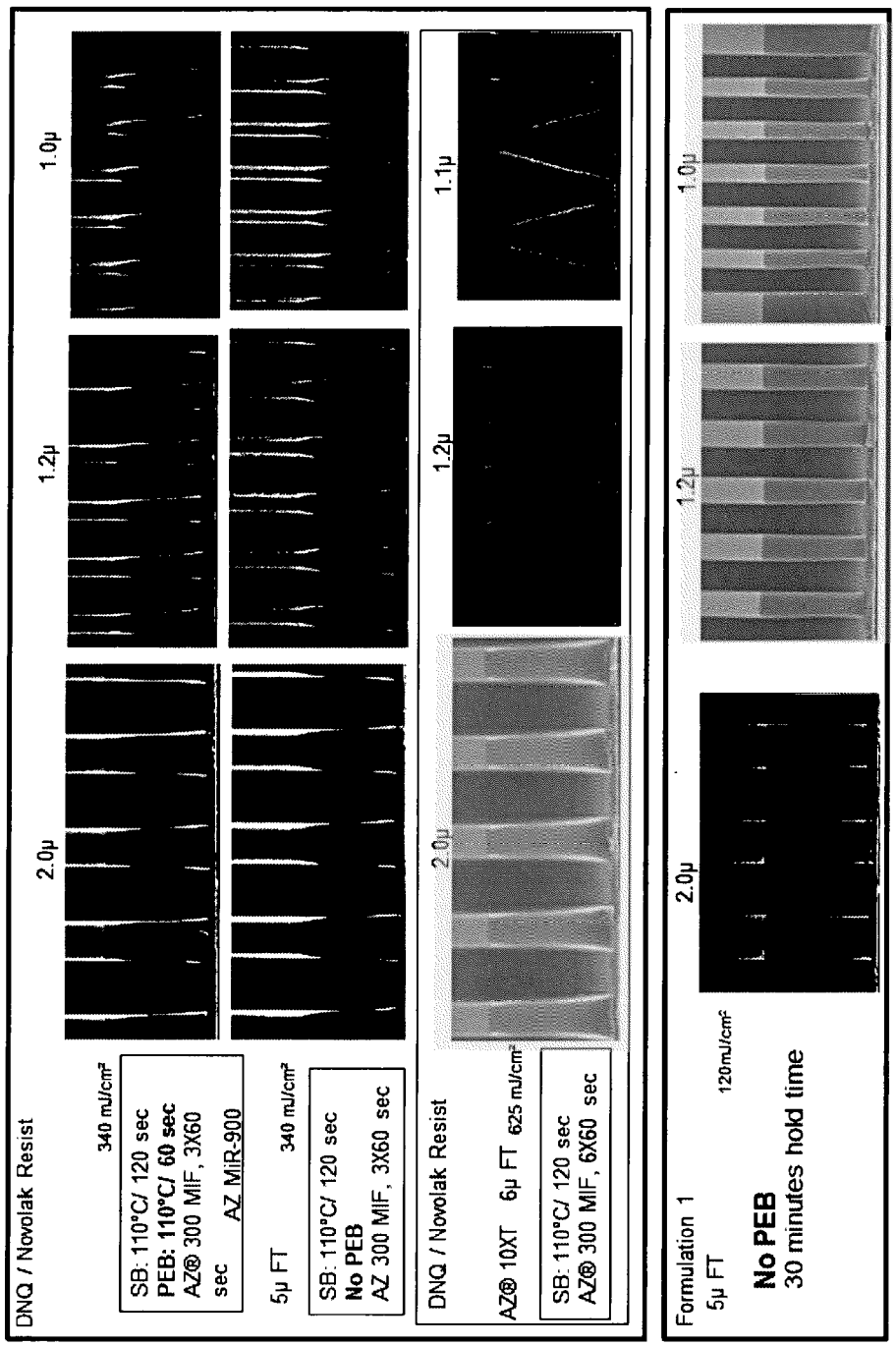

FIG. 6 show the superior pattern profiles of one of resist of this invention, Formulation (1), processed without PEB, compared to two conventional DNQ/Novolak resist products, (AZ® MiR-900) and (AZ®10XT) (EMD Performance Materials, AZ Products, Somerville, N.J.) processed with or without PEB at 5 µm film thickness. Both DNQ resist pattern lines are narrow at the pattern tops, losing some of their height at 1.0 µm lines and wide at the base. The resist patterns of this invention are vertical with full height retention and squared line tops as shown by the patterns of Formulation (1) processed without PEB, shown in FIG. 6. This Formulation required a slightly higher exposure dose (120 mJ/cm$^2$) than when processed with PEB, (100 mJ/cm$^2$) as in Example 1.

Acetal Blocked PHS Polymer Specifications:

Two different polymer suppliers were tested (Formulations (1) and (8)) showing only some differences in image quality. The polymer in Formulation (1) is preferred for the optimum results. These results are shown in FIG. 7. The analytical differences in these polymers are also shown in Table 2. The most significant characteristic difference between these two polymers is their PD (Mw/Mn), which is much narrower for Waco supplied polymer than DuPont polymer.

Example 1 Synthesis of CN6 Polymer in Table 1

The CN6 component in Table 1 was prepared by reacting ethyl vinyl ether (EVE) with a blend (60 wt % CZ6 and 40 wt % Novolak) without any acid catalyst (or other type of catalyst) added, in the same pot at elevated temperatures (120° C.) in a sealed system to prevent EVE loss. 87 gm of 50% solution of hydroxystyrene/t-butylacrylate copolymer (60%/40%) in PGMEA (43.5 gm solid polymer) was added to 72.1 gm of 47.1% solution of m-cresol/formaldehyde Novolak. Having a dissolution rate of 730 Å/second (as measured using the test method below), in PGMEA (33.96 gm solids), 5.15 gm of additional PGMEA and 10.41 gm ethyl vinyl ether (0.14458 moles) were placed in a round bottom, 3 neck 250 ml flask, equipped with a condenser, a thermometer and magnetic stirrer (Teflon coated magnet). The system was sealed with rubber stopper. The solution was heated gradually to 120° C. and kept at this temperature under good agitation for 8 hours and then was cooled to room temperature. No residual ethyl vinyl ether was detected in the solution. The theoretical solids content of this solution was 50.3%. This solution was used directly as is, without isolation of the solid polymer for resist Formulations. The dissolution rate of the polymer mixture prior to this reaction was 70 Å/S. The dissolution rate of the resulting polymer after the reaction was 4.1 Å/second.

Different versions of CN6 were also prepared which were characterized by their dissolution rates. The table below (Table 4) list a total of 16 reaction products of such preparation of different "CN6" reaction products prepared by varying the amount of ethyl vinyl ether molar ratio to the polymer blend. These polymers were characterized by their final dissolution rates.

CN6 Polymer (Component (1)) Characterization:

The resulting CN6 polymers were characterized by their final dissolution rates in AZ® 300MIF developer. The dissolution rate of the polymer is measured by measuring the coating film thickness (soft bake (SB) at 120° C. for 120 seconds) at different development times. Excellent correlation was obtained between the measured dissolution rates of the polymer as a function of the molar ratio of reacted EVE (ratio to the total OH groups on the polymer blend). This data is presented in table 5 Slight difference in results was detected assumed by some leak in the system during the reaction. The optimum results for CN6 dissolution rate was less than 5 Å/S, otherwise dark erosion may be significant and undesirable.

Table 5 Shows the measured dissolution rate of CN6 polymer (Å/second) as a function of the molar ratio of EVE reacted (ratio to the total OH groups in the polymer blend). The polymers and their blend ratio was kept the same as in example 9 for all. The amount of the reacted EVE is assumed to be essentially the same as the charged amount in these reactions since no residual EVE was detected at the end of these reactions.

TABLE 5

| % EVE to total OH | CN6 Polymer dissolution rate Å/Second | |
|---|---|---|
| Molar ratio | sealed reactions | Slight leaks |
| 0 | 134.75 | 134.75 |
| 5.1 | 61.38 | |
| 10.03 | 20.27 | |
| 15.25 | 4.08 | |
| 16 | | 9 |
| 17.9 | 1.49 | |
| 19.4 | 1.45 | |
| 19.85 | 1.2 | |
| 19.86 | 0.96 | |
| 19.87 | 0 | |
| 19.9 | | 1.84 |
| 20.6 | | 2.35 |
| 20.74 | 0.838 | |
| 20.82 | | 2.75 |
| 23 | | 1.3 |
| 26.5 | | 0.35 |

This data is also plotted in FIG. 8 to show two populations of data points. One population is slightly lower in dissolution rate values compared to the other for the same % EVE consumed and the same reaction conditions. The difference between the two populations is assumed to be caused by slight leaks in the reaction vessel compared to better sealed system.

The use of any acid catalyst in the attempted preparation of CN6 was found to be deleterious because it caused deprotection of the tert-butyl ester group. This was demonstrated by using the polymer hydroxstyrene/t-BA copolymer, CZ6, from DuPont and adding to it an acid which would typically be used to form an acetal blocked group by reacting a phenolic polymer with a vinyl ether as shown in Example 2.

Example 2: CZ6 with Toluene Sulfonic Acid (PTSA)

A mixtures was prepared consisting of 105.9 gm of a CZ6 polymer solution containing 40.2% solids, 30.72 gm of PGMEA and 0.345 gm of p-toluenesulfonic acid (Sigma Aldrich) dissolved in 6 gm PGMEA. The solution was heated at 120° C. for 18 hours. A residue and cloudy solution formed a few minutes after reaching 120° C. After 18 hours, extensive gel formation was observed at the walls of the flask. A clear solution was extracted and tested by FTIR and compared with unreacted CZ6 solution (both in PGMEA).

Thus the use of an acid catalyst caused extensive deprotection of the tert-butyl ester as evidenced both by the extensive formation of a PGMEA insoluble gel and also even in the material remaining still soluble in PGMEA, changes in its FT-IR spectra indicative of the deprotection reaction. Specifically, it was observed that there was d extensive drop in the intensity of the bands 1149 cm$^{-1}$ as well as 1393, 1396 cm$^{-1}$ attributed to the tert-butyl ester compared to the unreacted solution of CZ6 in PGMEA, FIG. 9. Since the preparation of CN6 involves using CZ6, this indicated that the process of preparing CN6 cannot be run using any acid catalyst since one of its reactants CZ6 contains an acid labile tert-butyl ester which would cleave releasing a free carboxylic acid in the presence of such an acid catalyst changing the nature of the final product obtained.

The invention claimed is:

1. A photoresist composition comprising:
   Component (1), comprising a reaction product formed in the absence of an acid catalyst between (i) a Novolak polymer, (ii) a polymer comprising substituted or unsubstituted hydroxystyrene and acrylate, methacrylate or a mixture of acrylate and methacrylate, the acrylate and/or methacrylate being protected by an acid labile group that requires a high activation energy for deblocking, and (iii) a compound selected from a vinyl ether and an unsubstituted or substituted, unsaturated heteroalicyclic;
   Component (2), comprising at least one heterocyclic thiol compound comprising a ring structure chosen from the general formulas:

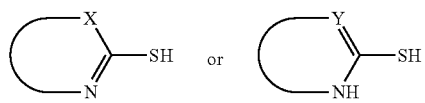

or tautomers thereof, wherein the ring structure is a single ring structure having 4-8 atoms, or a multi ring structure having 5-20 atoms, and wherein the single ring structure or the multi ring structure comprises an aromatic, non-aromatic, or heteroaromatic ring, and wherein X is coupled into the ring by a single bond and is selected from the group consisting of $CR_aR_b$, O, S, Se, Te, and $NR_c$, or X is coupled into the ring by a double bond and is selected from the group consisting of $CR_a$, and N, and Y is selected from the group consisting of $CR_a$ and N, and wherein $R_a$, $R_b$, and $R_c$ are independently selected from the group consisting of H, a substituted alkyl group having 1-8 carbon atoms, an unsubstituted alkyl group having 1-8 carbon atoms, a substituted alkenyl group having 1-8 carbon atoms, an unsubstituted alkenyl group having 1-8 carbon atoms, a substituted alkynyl group having 1-8 carbon atoms, an unsubstituted alkynyl group having 1-8 carbon atoms, a substituted aromatic group having 1-20 carbon atoms, a substituted heteroaromatic group having 1-20 carbon atoms, an unsubstituted aromatic group having 1-20 carbon atoms and an unsubstituted heteroaromatic group having 1-20 carbon atoms;

Component (3), comprising at least one polymer comprised of formula:

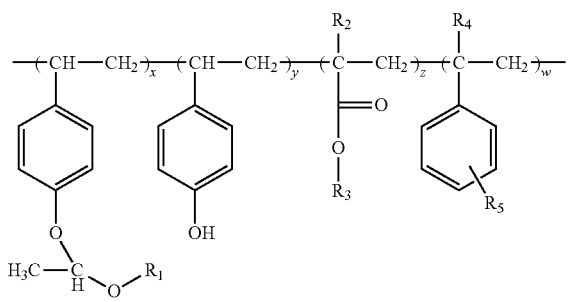

wherein $R_1$ is a unsubstituted or substituted alkyl or unsubstituted or substituted cycloalkyl, $R_2$, is hydrogen or a $C_1$ to $C_4$ alkyl, $R_3$ is a $C_1$ to $C_4$ alkyl or a $C_2$ to $C_4$ alkylenehydroxy moiety, $R_4$ is hydrogen or a $C_1$ to $C_4$ alkyl, $R_5$ is hydrogen or $C_1$ to $C_4$ alkyl, and x, y, z, and w are the mole % of each type of repeat unit where x is equal to about 30 to about 40 mole %, y is equal to about 60 to about 70 mole %, z is equal to about 0 to about 10 mole %, w is equal to 0 to about 10 mole %, where the sum of x, y, z, and w is equal to 100 mole % and the sum of z and w does not exceed about 10 mole %;

Component (4), comprising at least one photoacid generator additive which, upon under irradiation with radiation having a wavelength between about 365.4 nm and about 578.2 nm, releases a strong acid having a pKa equal to or smaller than −1;

Component (5), comprising at least one base additive;

Component (6), comprising an optional adhesion promoter selected from a-Novolak polymer, or a polyvinyl alkyl ether polymer;

Component (7), comprising a solvent.

2. The photoresist composition of claim 1 wherein Component (1) has a dissolution rate in 0.26 N TMAH less than 30 Å/second.

3. The photoresist composition of claim 1 wherein Component (1) is formed by reaction with a vinyl ether which has the formula:

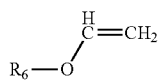

where $R_6$ is an unsubstituted or substituted alkyl or an unsubstituted or substituted cycloalkyl.

4. The photoresist composition of claim 3 wherein the vinyl ether is ethyl vinyl ether.

5. The photoresist composition of claim 1 wherein Component (1) the reaction product is formed by reaction with an unsubstituted or substituted, unsaturated heteroalicyclic.

6. The photoresist composition of claim 5 wherein the unsubstituted unsaturated heteroalicyclic is 3,4-dihydro-2H-pyran.

7. The photoresist composition of claim 1 wherein Component (1) is formed by reaction with a polymer comprised of formula:

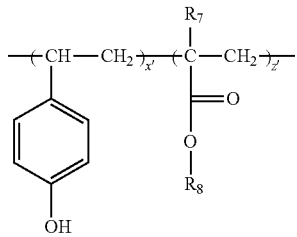

where $R_7$ is hydrogen or a $C_1$ to $C_4$ alkyl, $R_8$ is an acid labile group that requires a high activation energy for deblocking, and x', and z' are the mole % of each type of repeat unit, where x' is equal to about 55 to about 65 mole %, and z is equal to about 35 to about 45 mole %, where the sum of x' and z' is equal to 100 mole %.

8. The photoresist composition of claim 7 where $R_7$ is methyl, and $R_8$ is tert-butyl.

9. The photoresist composition of claim 8 where x' is about 60 mole % and z' is about 40 mole %.

10. The photoresist composition of claim 1 wherein in Component (2) the heterocyclic thiol compound is selected from the group consisting of unsubstituted triazole thiol, substituted triazole thiol, unsubstituted imidazole thiol, substituted imidazole thiol, substituted triazine thiol, unsubstituted triazine thiol, a substituted mercapto pyrimidine, unsubstituted mercapto pyrimidine, a substituted thiadiazole-thiol, unsubstituted thiadiazole-thiol, substituted indazole thiol, unsubstituted indazole thiol, tautomers thereof, and combinations thereof.

11. The photoresist composition of claim 1 wherein in Component (2) the heterocyclic thiol compound is selected from the group consisting of 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercapto-6-methylpyrimidin-4-ol, 1-methyl-1H-imidazole-2-thiol, 1,3,4-thiadiazole-2,5-dithiol, 1H-indazole-3-thiol, tautomers thereof and combinations thereof.

12. The photoresist composition of claim 1 wherein in Component (3) the polymer comprises formula:

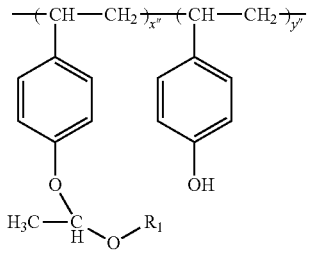

where $R_1$ is a unsubstituted or substituted alkyl or unsubstituted or substituted cycloalkyl and x", and y" are the mole % of each type of repeat unit where x" is equal to about 30 to about 40 mole %, y" is equal to about 60 to about 70 mole %, and where the sum of x", and y" is 100 mole.

13. The photoresist composition of claim 12 where $R_1$ is methyl.

14. The photoresist composition of claim 1 wherein in Component (3), the polymer comprises formula:

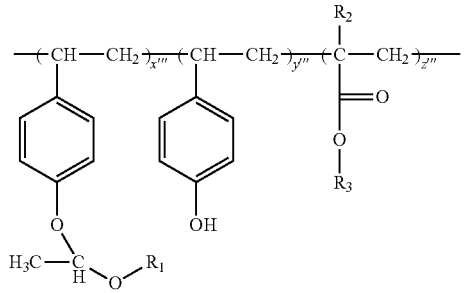

cycloalkyl, $R_2$ is hydrogen or a $C_1$ to $C_4$ alkyl, $R_3$ is a $C_1$ to $C_4$ alkyl or a $C_2$ to $C_4$ alkylenehydroxy moiety and x''', y''', and z''' are the mole % of each type of repeat unit where x''' is equal to about 30 to about 40 mole %, y''' is equal to about 60 to about 70 mole %, z''' is equal to about 2 to about 10 mole %, where the sum of x''', y''' and z''' is equal to 100 mole % and z''' does not exceed about 10 mole %.

15. The photoresist composition of claim 14 where $R_1$ and $R_2$ are methyl and $R_3$ is a $C_1$ to $C_4$ alkyl.

16. The photoresist composition of claim 1 wherein in Component (3), the polymer comprises formula:

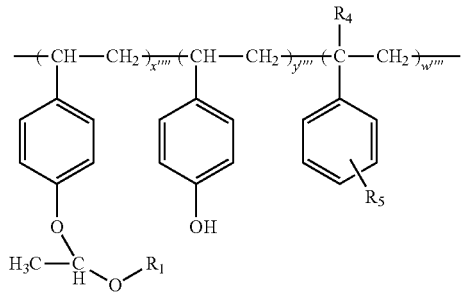

where $R_1$ is an unsubstituted or substituted alkyl or unsubstituted or substituted cycloalkyl, $R_2$ is hydrogen or a $C_1$ to $C_4$ alkyl, $R_4$ is hydrogen or a $C_1$ to $C_4$ alkyl, $R_5$ is hydrogen or $C_1$ to $C_4$ alkyl, and x'''', y'''', and w'''' are the mole % of each type of repeat unit where x is equal to about 30 to about 40 mole %, y'''' is equal to about 60 to about 70 mole %, w is equal to about 1 to about 10 mole %, where the sum of x'''', y'''' and w'''' is equal to 100 mole % and w'''' does not exceed about 10 mole %.

17. The photoresist composition of claim 1 wherein in Component (7), the solvent, ranges from about 50 wt % to about 80 wt % of the total weight of the photoresist composition and the amount of Component (1) ranges from about 15 to about 80 wt % of total solids, the amount of Component (2) ranges from about 0.02 to about 1 wt % of total solids, the amount of Component (3) ranges from about 20 to about 85 wt % of total solids, the amount of Component (4) ranges from about 0.4 to about 2.5 wt % of total solids, the amount of Component (5) ranges from about 0.05 to about 0.4 wt % of total solids, and Component (6) ranges from about 0 to about 15 wt % of solids and that further the total wt % of the solid components (1), (2), (3), (4), (5), and (6) equals 100 wt %.

18. The photoresist composition of claim 1 where in Component (4), the photoacid generator, is selected from the group consisting of diazonium salts, iodonium salts, a sulfonium salts, diazosulfonyl compounds, sulfonyloxy imides, nitrobenzyl sulfonate esters, and imidosulfonates.

19. The photoresist composition of claim 1 where in Component (4), the photoacid generator is a sulfonyloxy imide selected from the ones having formula:

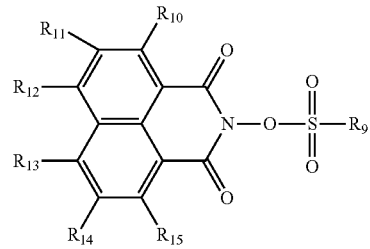

where $R_9$ is selected from the group consisting of a perfluoroalkyl, a partially fluorinated alkyl, a perfluoro (alkyloxyalkylene), a perfluoro(alkyl)alkylene, a partially fluorinated(alkyl) alkylene, a partially fluorinated (alkyleneoxyalkylene), an alkyl, an alkylalkylene, a substituted alkylalkylene, an aryl, a perfluoroaryl, and a partially fluorinated aryl; $R_{10}$ to $R_{15}$ are independently selected from the group consisting of hydrogen, an alkyl, a perfluoroalkyl, a partially fluorinated alkyl, an alkoxy, an alkoxyalkylene (alkylene-O-alkyl), an alkoxyalkyleneoxy (—O-alkylene-O-alkyl), a thioalkoxy, and an alkenyl (—CH=CH-Rp) wherein the Rp group is selected from the group consisting of an alkyl, a carbonyloxyalkyl (—C=O—O-alkyl), and an aryl.

20. A coated substrate comprising: a substrate having thereon a coating layer of the photoresist composition of claim 1.

21. A method for forming a photoresist relief image on a substrate comprising: (a) applying on a substrate a layer of the photoresist composition of claim 1, and (b) exposing the photoresist layer to activating radiation and developing the exposed photoresist layer.

* * * * *